United States Patent
Xiu

(10) Patent No.: US 8,890,591 B1
(45) Date of Patent: Nov. 18, 2014

(54) CIRCUIT AND METHOD OF USING TIME-AVERAGE-FREQUENCY DIRECT PERIOD SYNTHESZIER FOR IMPROVING CRYSTAL-LESS FREQUENCY GENERATOR FREQUENCY STABILITY

(71) Applicant: Liming Xiu, Plano, TX (US)

(72) Inventor: Liming Xiu, Plano, TX (US)

(73) Assignee: Liming Xiu, Plano, TX (US)

( * ) Notice: Subject to any disclaimer, the term of this patent is extended or adjusted under 35 U.S.C. 154(b) by 0 days.

(21) Appl. No.: 14/140,016

(22) Filed: Dec. 24, 2013

(51) Int. Cl.
*H03L 7/06* (2006.01)

(52) U.S. Cl.
CPC .................................. *H03L 7/06* (2013.01)
USPC ....... 327/156; 327/147; 375/240.01; 375/340

(58) Field of Classification Search
USPC .................. 327/147, 156; 375/240.01, 340
See application file for complete search history.

(56) References Cited

U.S. PATENT DOCUMENTS

| | | | |
|---|---|---|---|
| 7,830,216 B1 * | 11/2010 | Seth et al. .................. | 331/177 R |
| 8,120,389 B2 * | 2/2012 | Xiu .............................. | 327/105 |
| 8,165,199 B2 * | 4/2012 | Xiu et al. .................. | 375/240.01 |
| 8,195,972 B2 * | 6/2012 | Renner et al. .................. | 713/401 |
| 2009/0103604 A1 * | 4/2009 | Xiu et al. .................. | 375/240.01 |
| 2011/0131439 A1 * | 6/2011 | Renner et al. .................. | 713/401 |
| 2011/0285439 A1 * | 11/2011 | Xiu ............................... | 327/159 |
| 2012/0229171 A1 * | 9/2012 | Xiu et al. ....................... | 327/107 |
| 2014/0093015 A1 * | 4/2014 | Xiu ............................... | 375/340 |

* cited by examiner

*Primary Examiner* — Adam Houston

(57) ABSTRACT

A Time-Average-Frequency direct period synthesizer is used to improve crystal-less frequency generator's frequency stability. It includes (a) a temperature sensor circuit to compensate temperature-induced frequency instability; (b) a voltage sensor circuit to compensate voltage-induced frequency instability; (c) a calibration circuit to correct manufacture-related frequency error; (d) a frequency control word update circuit to receive the temperature- and voltage-related frequency adjustments, and the calibration-related adjustment, to generate the corresponding frequency control word in a predetermined schedule; (f) a Time-Average-Frequency direct period synthesizer to receive said frequency control word in the predetermined schedule and produce a clock signal with a frequency that is stable and accurate by counteracting the frequency variation caused by crystal-less oscillators' temperature and voltage dependence and correcting the frequency error introduced in manufacture process. Methods of correcting crystal-less oscillators' frequency error and compensating its frequency variation are also disclosed.

14 Claims, 14 Drawing Sheets

US 8,890,591 B1

CIRCUIT AND METHOD OF USING TIME-AVERAGE-FREQUENCY DIRECT PERIOD SYNTHESZIER FOR IMPROVING CRYSTAL-LESS FREQUENCY GENERATOR FREQUENCY STABILITY

FIELD OF THE INVENTION

The present invention generally relates to the field of integrated circuit. More specifically, embodiments of the present invention pertain to circuit and method of using Time-Average-Frequency direct period synthesizer to compensate the temperature- and voltage-induced frequency instability and manufacture-related frequency error on crystal-less frequency generator.

DISCUSSION OF THE BACKGROUND

As semiconductor process continually advances, more and more system functions are being integrated into single chip for more resource-and-energy efficient implementation and more reliable-and-better performance. In this trend of SoC integration however there is still one last functional block, timing reference, which is hard to be integrated into processing chip. Since electronic circuit is born naturally for handling voltage level and has no capability of producing sense-of-time by itself, it uses the method of level-switching-over-a-threshold to indirectly generate the sense-of-time. As a result, it is very difficult for electronic circuit to produce a highly accurate and reliable timing source by itself. FIG. 1 is a diagram that shows four types of timing sources with different frequency characteristics. An ideal timing source that produces an accurate and stable frequency has a frequency characteristic of 110 where $f_0$ is the desired frequency and $\delta f$ is the frequency deviation from $f_0$. The characteristic of a stable but inaccurate timing source is shown in plot 120 where its output frequency does not vary with time but is at a value which is different than the desired value $f_0$. Plot 130 presents the frequency characteristic of an accurate but unstable timing source where the frequency varies with time but its average value over time is at $f_0$. The characteristic of an inaccurate and unstable timing source is depicted in plot 140 where the frequency varies with time and its average value is not at $f_0$. The frequency error is usually introduced by manufacture imperfection, and/or device aging. The frequency variation is mainly due to the timing source's temperature and supply voltage dependence.

Traditionally, quartz crystal rock has been chosen to serve as the timing source for almost every electronic system thanks to its high precision mechanical vibration when a voltage is applied to it. For several decades, crystal based CMOS oscillator is the timing-reference-of-choice for electronic system. Despite its excellent timing quality, however, there are several concerns with crystal based oscillator. The lead time to develop a crystal of requested frequency is long, usually ten weeks at minimum; it is difficult to make quartz crystal of high frequency (over 100 MHz); the physical size of the crystal oscillator is large that is undesirable in many systems, especially for portable applications; the frequency flexibility is not good which could be unsatisfactory in certain cases. All these factors have motivated the search for crystal replacement. An all-silicon, self-contained, self-referenced timing solution has undisputable commercial advantage.

In recent years, MEMS (Micro-Electro-Mechanical Systems) resonator has been investigated as silicon timing source [1-2], owing to its decent Q factor and silicon-based nature. FIG. 2 shows the block diagram of a MEMS resonator based oscillator. A MEMS resonator 210 generates a mechanical vibration at a fixed frequency. A sustaining circuit 220 converts the mechanical vibration into electrical pulse. It also help sustain the MEMS resonator's vibration. The electrical pulse bearing the MEMS resonator's vibration frequency (usually at MHz range) is used as the reference frequency to a fractional-N Phase Locked Loop (PLL) 230. The output of the PLL is usually at frequency of tens of MHz. After being fed through an output driver 260, it is used as the timing reference signal for other electronic systems. A calibration circuit 240 is used to correct the frequency inaccuracy introduced in manufacture process. This is accomplished by comparing the output with an external signal of known frequency and applying the result to trim the MMES resonator. To compensate the frequency variation caused by temperature (or supply voltage) change, a temperature (or voltage) compensation circuit 250 is incorporated in the system. A temperature (or voltage) sensor reports the temperature (or voltage) change. A control signal, generated by checking the sensor output against a frequency-vs.-temperature (or voltage) look-up table, is applied to the PLL's fractional divider to counteract the frequency variation.

To improve the compatibility with standard CMOS process, CMOS self-referenced oscillator has also been researched as silicon timing source. A ring-based RC oscillator (RCO) is reported in [3] as a start-up clock for microcontroller. A more serious effort is to use LC-VCO based CMOS (LCO) oscillator, such as reported in [4-5]. FIG. 3 is a block diagram showing the working principle of a LCO timing source. A LCO 320 oscillates at high frequency, usually at GHz range. Its output is fed to a divider and driver circuit 340. The divided down signal is used as the timing reference signal of a frequency $f_{out}$, usually at tens or hundreds MHz. A temperature (or voltage) compensation circuit 310 which consists of a temperature (or voltage) sensor and a compensation circuit is used to compensate the temperature-induced (or voltage-induced) LCO frequency variation. A calibration circuit 330 is incorporated to correct the frequency error introduced in manufacture process.

Although both MEMS-based oscillator and CMOS self-referenced oscillators have achieved some commercial success, compared to crystal based oscillator, they suffer from the two problems of frequency error and frequency instability more severely. Unlike crystal oscillator whose frequency can be made accurately (within about tens of ppm of the target), crystal-less oscillators have difficulty in oscillating at the exact frequency designed. Most of times, post-silicon trimming is required. This trimming process is also termed calibration. Moreover, compared to highly stable crystal, all crystal-less oscillators' oscillation frequency varies with process, supply voltage and temperature in a significant way that compensation must be employed. FIG. 4 shows the general scheme of this calibration and compensation approach. A crystal-less oscillator 410 operates within an environment 420. The environmental variables include temperature and power supply voltage. A frequency calibration circuit 440 is used to correct the frequency error introduced in the manufacture process. A frequency compensation circuit 450 is used to compensate the frequency variation induced by temperature and supply voltage changes. Both the outputs from the trimming circuit and the compensation circuit are fed to a frequency tuning circuit 430. For each type of oscillator (MEMS, LCO, RCO), its tuning circuit has unique tuning mechanism to adjust its output frequency. The general function of this circuit is to take the outputs from the trimming and the compensation circuit and applying the corresponding mechanism to make the necessary frequency adjustment. In one way or another, the frequency trimming and process-voltage-temperature compensation are all related to the frequency fine tune capability of the oscillators. For crystal-less oscillators, the trimming and temperature compensation techniques are the keys for building a good silicon timing source.

Time-Average-Frequency (TAF thereafter) is a novel concept that is introduced in 2008[6]. Its purpose is to address the on-chip clock generation problem in modern environment. This concept emerges from the modern trend of replacing traditional analog circuit blocks with digital ones. It is an effort motivated by the modern nano-scale VLSI technologies and the push for smaller, more power efficient designs and single-chip integration. Using Flying-Adder (FA thereafter) technology [7-8] as its circuit implementation, this concept has been used successfully in numerous commercial products for over a decade. The two distinguished features of Time-Average-Frequency direct period synthesis are fine frequency resolution and fast frequency switching. These two features are especially useful for realizing the frequency fine tune function used in crystal-less oscillators' calibration and compensation.

FIG. 5 shows the working principle of Time-Average-Frequency direct period synthesis. A direct period synthesizer 510 takes a base time unit $\Delta$ 520 and a frequency (more precisely period) control word 530 F=I+r as its inputs, where I is an integer and r is a fraction. It creates two types of cycles 551 $T_A$=I·$\Delta$ and 552 $T_B$=(I+1)·$\Delta$. A clock pulse train 540 is then generated by stringing the pulses of type $T_A$ and $T_B$ in an interleaved fashion. The fraction r controls the possibility of $T_A$ and $T_B$ occurrence. The Time-Average-Frequency of synthesized signal CLK 550 is $f_{TAF}$=1/$T_{TAF}$ and it can be calculated using (1). In general, there could be n types of pulses used in synthesizing the Time-Average-Frequency signal CLK. The general form is expressed in (2) where $a_i$ is the possibility-of-occurrence of type $T_i$.

$$T_{TAF}=(1-r)\cdot T_A+r\cdot T_B=(I+r)\cdot\Delta; f_{TAF}=1/T_{TAF} \quad (1)$$

$$T_{TAF}=a_1\cdot T_1+a_2\cdot T_2+\ldots+a_n\cdot T_n, \tau=a_i=1 \text{ for } i=1 \text{ to } n;$$
$$f_{TAF}=1/1T_{TAF} \quad (2)$$

The base unit $\Delta$ can be created from a multi-stages voltage controlled oscillator (VCO) 570. This VCO has multiple outputs that are equally-spaced-in-phase (all the outputs are evenly distributed in a time frame of one oscillation cycle). The time span between any two adjacent VCO outputs is the base unit $\Delta$. The VCO could be locked to a known reference frequency $f_r$ through a PLL 560. In this case, the value of $\Delta$ will be known and can be calculated as $\Delta$=1/(K·N·$f_r$) where N is the PLL dividing ratio and K is the number of VCO outputs. More implementation details regarding Time-Average-Frequency direct period synthesis can be found in [7-8].

Equation (1) indicates that this period synthesizer can be viewed as a frequency generator f(r) when r is considered as the frequency control variable (integer I is a fixed number in this consideration). Equation (1) can be rearranged into (3) where the subscript TAF is dropped for brevity. Equation (4) can be derived under the condition of |r|<<I.

$$f(r)=\frac{1}{T(r)}=\frac{1}{(I+r)\Delta}=\frac{f_h}{I+r}, \text{ where } f_h=1/\Delta \quad (3)$$

$$\frac{df}{f}(r)\approx-\frac{dr}{I}, \text{ when } |r|\ll I \quad (4)$$

In circuit implementation, r=p/q is implemented using a register of $\log_2(q)$ bits where both p and q are integers, q is a number of power of 2 and p<q. The toggling of the LSB of this register represents the smallest dr. In this disclosure, we are interested in using TAF to assist MEMS, LCO and RCO oscillators in their frequency fine-tune process. For this reason, we only study (4) when dr is small. FIG. 6 illustrates the TAF synthesizer frequency tuning capability's dependence on I and r. In the top plot 610, there is a register of 20 bits (q=1048576) used for representing the fraction r. Thus, the size of this register's LSB is $2^{-20}$. The plot shows the frequency change when r varies from −20 to 20 LSB, for several I values. The five traces correspond to I=8, 16, 32, 64 and 128, respectively. As indicated by (4) and confirmed by the traces in this plot, implementation with larger I produces finer frequency resolution. In the bottom plot 620, I is fixed at 32. The five traces correspond to different LSB sizes: $2^{-16}$, $2^{-19}$, $2^{-20}$, $2^{-21}$ and $2^{-24}$. These traces reveal the fact that the more bits are used for representing fraction, the better the frequency resolution is. From plots 610 and 620, a further observation can be made that the frequency response is almost linear when |r|<<I.

Several real measurement results from a Time-Average-Frequency direct period synthesizer will be given next to illustrate its frequency fine tuning capability. The synthesizer uses the circuit structure of FIG. 5 with N=54 and K=8. The reference frequency is $f_r$=12.000424 MHz. As a result, $\Delta$=1/(K·N·$f_r$) is calculated as 192.8943225 ps. FIG. 7 shows the measurement result of the TAF synthesizer when frequency control word F=192. In this setting, I=192 and r=0. From equation (1), it is calculated that the output frequency is, $T_{TAF}$=37.03570992 ns and $f_{TAF}$=27.0009675 MHz. Plot 710 in the left is the phase noise measurement; plot 720 in the right is the spectrum measurement. The measured frequency 27.0009675 MHz, which agrees with the calculated, is displayed in the plot as 730.

FIG. 8 shows the measurement result of another frequency control word F=192+3/$2^{17}$. In this setting, I=192 and r=3/$2^{17}$. Therefore, by using (1), the calculated result is $T_{TAF}$=37.03571434 ns and $f_{TAF}$=27.0009643 MHz. Plot 810 is the phase noise measurement; plot 820 is the spectrum measurement. The measured frequency 27.0009644 MHz, which is very close to the calculated 27.0009643 MHz, is displayed in the plot as 830. This example shows that by adding a small fraction r=3/$2^{17}$, the output frequency is changed by −3.1 MHz from the original $f_{TAF}$=27.0009675 MHz. This is a frequency adjustment of −0.12 ppm.

FIG. 9 shows the measurement result of a third frequency control word F=192+39/$2^{17}$. In this setting, I=192 and r=39/$2^{17}$. Therefore, by using (1), the calculated result is $T_{TAF}$=37.03576732 and $f_{TAF}$=27.0009257 MHz. Plot 910 is the phase noise measurement; plot 920 is the spectrum measurement. The measured frequency 27.0009252 MHz, which is very close to calculated 27.0009257 MHz, is displayed in the plot as 930. This example shows that by adding a fraction r=39/$2^{17}$, the output frequency is changed by −41.8 MHz from the original $f_{TAF}$=27.0009675 MHz. This is a frequency adjustment of −1.55 ppm.

FIGS. 10, 11 and 12 are the measurement results using a different base time unit $\Delta$. In these cases, K=8, N=200 and the reference frequency is still $f_r$=12.000424 MHz. As a result, $\Delta$=1/(K·N·$f_r$), is calculated as 52.08149303 ps. FIG. 10 shows the case of frequency control word F=8. Using (1), the calculation result is $T_{TAF}$=416.6519443 ps and $f_{TAF}$=2.4000848 GHz. Plot 1010 in the left is the phase noise measurement; plot 1020 in the right is the spectrum measurement. The measured frequency 2.4000848 GHz, which agrees with the calculated, is displayed in the plot as 1030

FIG. 11 shows the measurement result of another frequency control word F=8+1/$2^{20}$. In this setting, I=8 and r=1/$2^{20}$. Therefore, by using (1), the calculated result is $T_{TAF}$=416.6519939087 ps and $f_{TAF}$=2.400084518 GHz. Plot 1110 is the phase noise measurement; plot 1120 is the spectrum measurement. The measured frequency 2.400084487, which is very close to the calculated 2.400084518 GHz, is displayed in the plot as 1030. This example shows that by adding a small fraction r=1/$2^{20}$, the output frequency is changed by −317 Hz from the original $f_{TAF}$=2.4000848 GHz. This is a frequency adjustment of −0.12 ppm.

FIG. 12 shows the measurement result of another frequency control word F=8+13/$2^{20}$. In this setting, I=8 and r=13/$2^{20}$. Therefore, by using (1), the calculated result is $T_{TAF}$=416.65258993417 ps and $f_{TAF}$=2.400081085 GHz. Plot 1210 is the phase noise measurement; plot 1220 is the spectrum measurement. The measured frequency 2.400081072, which is very close to the calculated 2.400081085 GHz, is displayed in the plot as 1230. This example shows that by adding a small fraction r=13/$2^{20}$, the output frequency is changed by −3.73 KHz from the original $f_{TAF}$=2.4000848 GHz. This is a frequency adjustment of −1.55 ppm. Table I summarizes the results from FIG. 7 to FIG. 12. It is seen that this Time-Average-Frequency direct period synthesizer is able to fine tune its output frequency to sub-ppm range and the tuning characteristic can be described by equation (4).

mental evidence is provided by FIG. 14 where this behavior can be observed directly. In this case, Δ=62.5 ps and F=8+$2^{-15}$ (I=8, r=1/$2^{15}$, p=1, q=$2^{15}$). Therefore, $T_A$=8Δ=500 ps and $T_B$=9Δ=562.5 ps. For every q (=$2^{15}$=32768) cycles, there are one $T_B$ cycle and 32767 $T_A$ cycles. The plot 1410 shows the measured period-vs.-cycle distribution for about 40K cycles (about 20 us). The y-axis is the measured period. The x-axis is the clock cycle. The plot 1420 adds the measurement data with cursors assigned to the two $T_B$ cycles for visualization. As seen, between the two $T_B$ cycles, the measured number of cycles is 32.77 K which agrees with the predication of 32768. Plot 1430 shows the corresponding statistics of this measurement.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY OF THE INVENTION

It is therefore an object of the present invention to use the Time-Average-Frequency direct period synthesizer's precise frequency tuning capability to help adjust crystal-less frequency generator's output frequency in very fine step. It is a further object of the present invention to tune the crystal-less frequency generator's output frequency in such a way that the frequency adjustment counteracts the frequency variations caused by temperature and power supply voltage changes. It

TABLE I

| Figure | Base time unit Δ | I | r | dr/I = r/I | f (measured) | δf (measured) | δf/f |
|---|---|---|---|---|---|---|---|
| FIG. 7 | 192.8943225 ps | 192 | 0 | 0 | 27.0009675 MHz | 0 | 0 |
| FIG. 8 | 192.8943225 ps | 192 | 3/$2^{17}$ | 0.1192 ppm | 27.0009644 MHz | 3.1 Hz | 0.1148 ppm |
| FIG. 9 | 192.8943225 ps | 192 | 39/$2^{17}$ | 1.5497 ppm | 27.0009252 MHz | 42.3 Hz | 1.5667 ppm |
| FIG. 10 | 52.08149303 ps | 8 | 0 | 0 | 2.40008480 GHz | 0 | 0 |
| FIG. 11 | 52.08149303 ps | 8 | 1/$2^{20}$ | 0.1192 ppm | 2.48008449 GHz | 317 Hz | 0.1321 ppm |
| FIG. 12 | 52.08149303 ps | 8 | 13/$2^{20}$ | 1.5497 ppm | 2.40008107 GHz | 3.73 KHz | 1.555 ppm |

From (3), it is understood that the output frequency is inversely proportional to the control word F=I+r when base time unit Δ is fixed. Further evidence is provided in FIG. 13. In FIG. 13, a Time-Average-Frequency direct period synthesizer's frequency transfer function is plotted using data collected from a HP 53131A frequency counter of 12-digits resolution. In this case, K=8, N=12 and $f_r$=125 MHz. This results in Δ=1/(K·N·$f_r$)=83.333 ps. In plot 1310, the frequency control word F varies from 6 to 16. The dots are measured frequency using the frequency counter. The curve is obtained by using equation (3). The measured data agrees with calculated very well. As shown, frequency is changed with control word in 1/x fashion. This is because that period has a linear relationship with control word. Plot 1320 shows a series of measurement points around the area of F=8. The dots are the measured data obtained from using the frequency counter. The curve is calculated from equation (3). It is confirmed that, in small area, the frequency transfer function is almost linear.

As explained previously, Time-Average-Frequency direct period synthesizer can use two types of pulses in an interleaved fashion to achieve the desired frequency. The experiis still an object of the present invention to use the Time-Average-Frequency direct period synthesizer's frequency generation capability to correct the frequency error introduced in the manufacture process of the crystal-less oscillators.

The present invention relates to circuits and systems that use Time-Average-Frequency in their clocks. Thus, the present invention advantageously utilizes the features of fine frequency resolution and fast frequency switching enabled by Time-Average-Frequency direct period synthesis. By counteracting frequency variation and correcting frequency error, it is possible to make an inaccurate and unstable crystal-less oscillator into an accurate and stable frequency (timing) source. By using Time-Average-Frequency concept, the present invention can result in a frequency (timing) source of lower cost and better performance. These and other advantages of the present invention will become readily apparent from the detailed description of various embodiments below.

DETAILED DESCRIPTION

Figure 1:
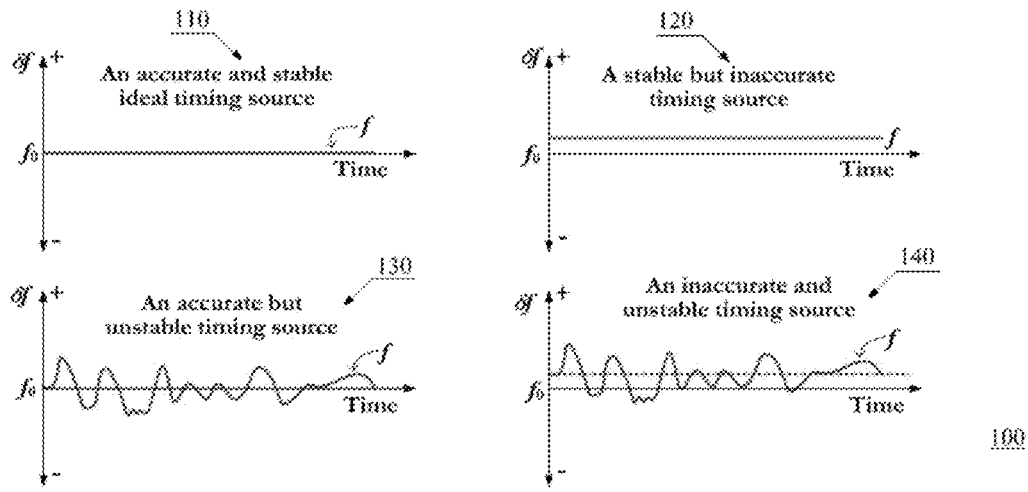
FIG. 1 is a diagram showing four types of frequency (timing) sources having different characteristics on their frequency stability.
Figure 2:
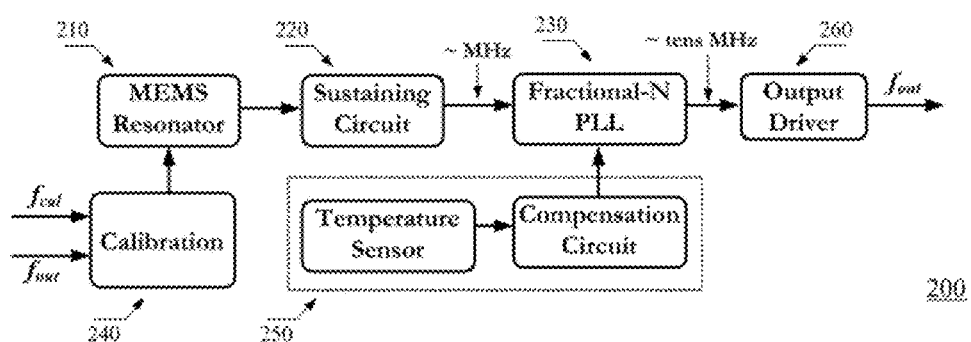
FIG. 2 is an electrical diagram, in block form, showing a MEMS resonator used as a frequency (timing) source.
Figure 3:
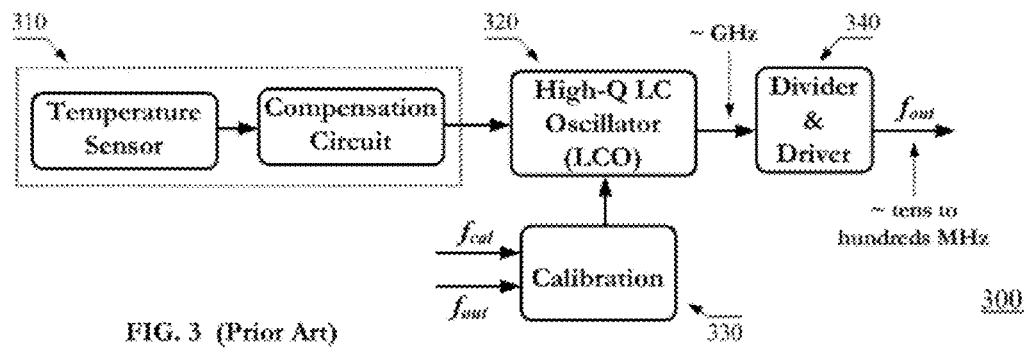
FIG. 3 is an electrical diagram, in block form, showing a LCO oscillator used as a frequency (timing) source.
Figure 4:
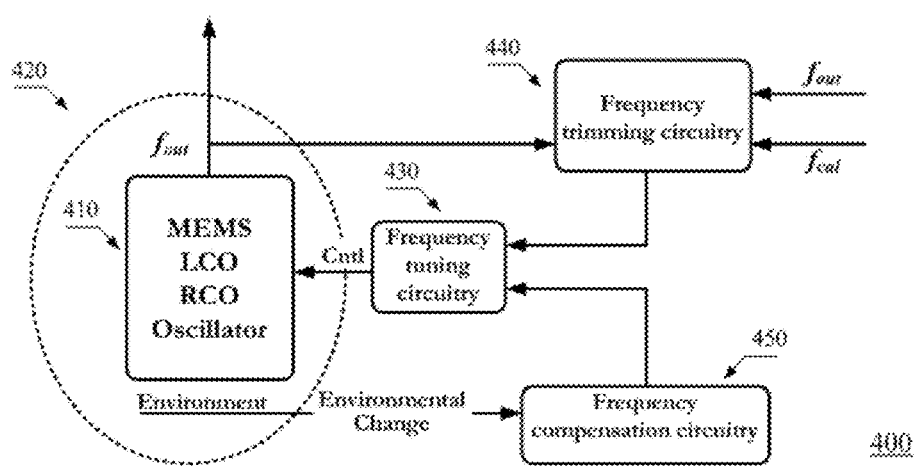
FIG. 4 is an electrical diagram, in block form, showing the principle of calibration and compensation to improve crystal-less oscillators' frequency quality.
Figure 5:
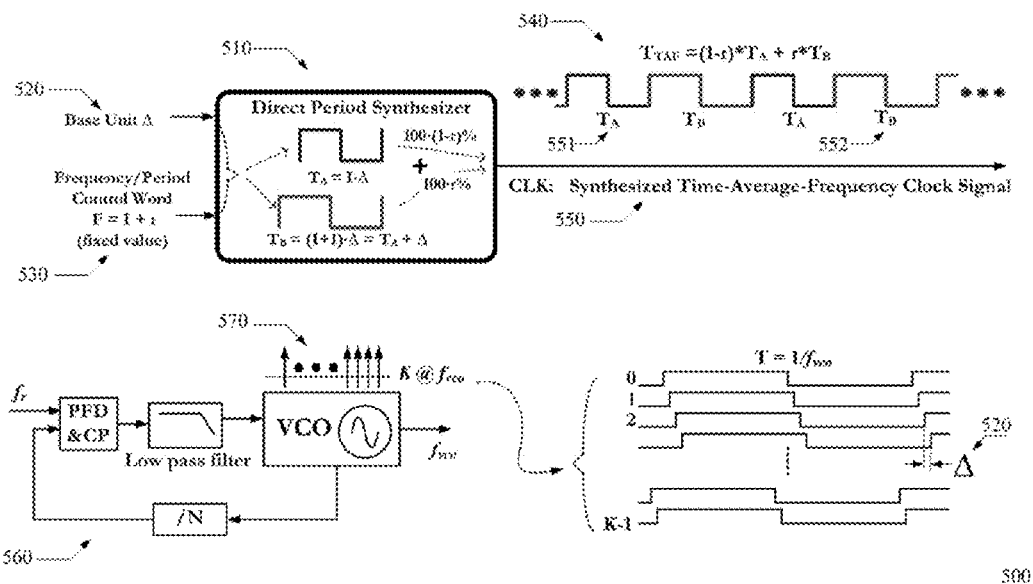
FIG. 5 is an electrical diagram, in block form, showing the working principle of Time-Average-Frequency direct period synthesizer.
Figure 6:
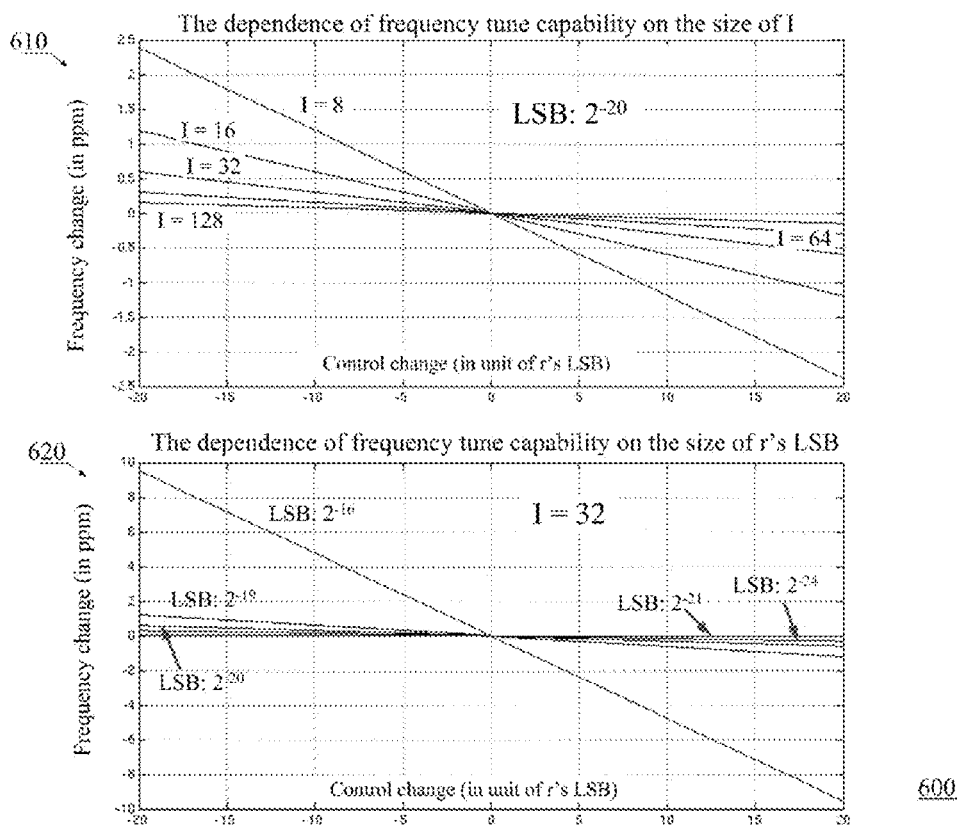
FIG. 6 is a diagram showing Time-Average-Frequency direct period synthesizer's output frequency dependence on frequency control word.
Figure 7:
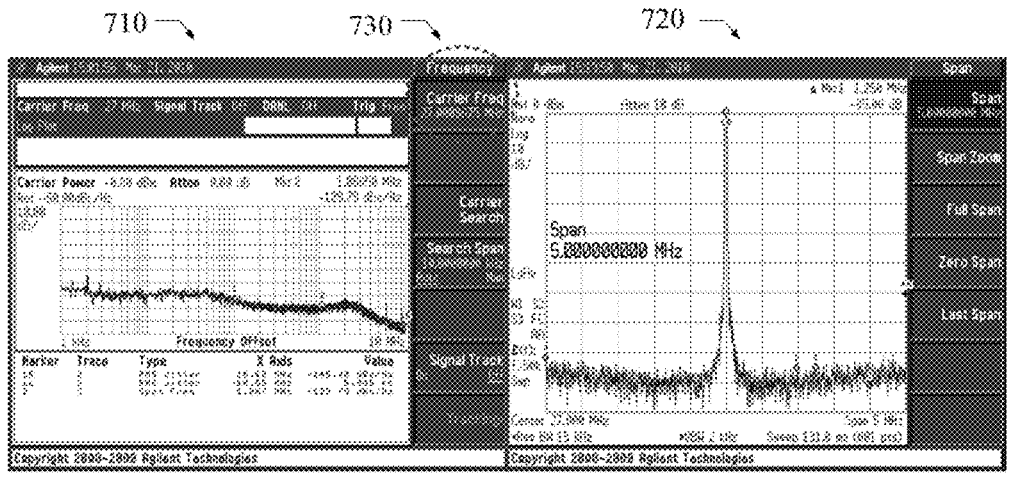
FIG. 7 is a diagram showing the spectrum and phase noise plots from a clock signal of 27.0009675 MHz generated from a Time-Average-Frequency direct period synthesizer.
Figure 8:
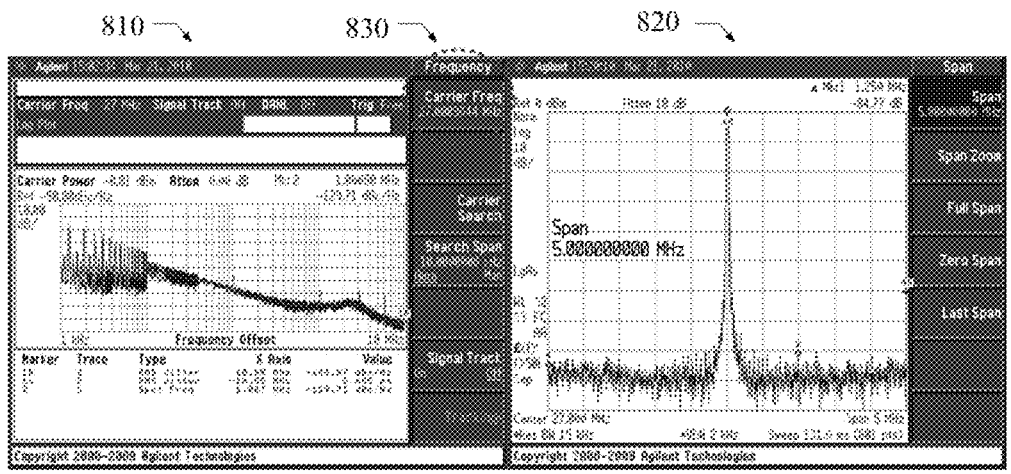
FIG. 8 is a diagram showing the spectrum and phase noise plots from a clock signal of 27.0009644 MHz generated from a Time-Average-Frequency direct period synthesizer.

Reference will now be made in detail to various embodiments of the invention, examples of which are illustrated in the accompanying drawings. While the invention will be described in conjunction with the following embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions that follow are presented in terms of processes, procedures, logic blocks, functional blocks, processing, and other symbolic representations of operations on data bits, data streams or waveforms within a computer, processor, controller and/or memory. These descriptions and representations are generally used by those skilled in the arts of VLSI-circuit-and-system design to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

It should be borne in mind, however, that all of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," "displaying" or the like, refer to the action and processes of a computer or signal processing system, or similar processing device (e.g., an electrical, optical, or quantum computing or processing device), that manipulates and transforms data represented as physical (e.g., electronic) quantities. The terms refer to actions and processes of the processing devices that manipulate or transform physical quantities within the component(s) of a system or architecture (e.g., registers, memories, flip-flops, other such information storage, transmission or display devices, etc.) into other data similarly represented as physical quantities within other components of the same or a different system or architecture.

Furthermore, for the sake of convenience and simplicity, the terms "clock," "time," "rate," "period," "frequency" and grammatical variations thereof are generally used interchangeably herein, but are generally given their art-recognized meanings. Also, for convenience and simplicity, the terms "data," "data stream," "waveform" and "information" may be used interchangeably, as may the terms "connected to," "coupled with," "coupled to," and "in communication with" (each of which may refer to direct or indirect connections, couplings, and communications), but these terms are also generally given their art-recognized meanings.

Figure 15:
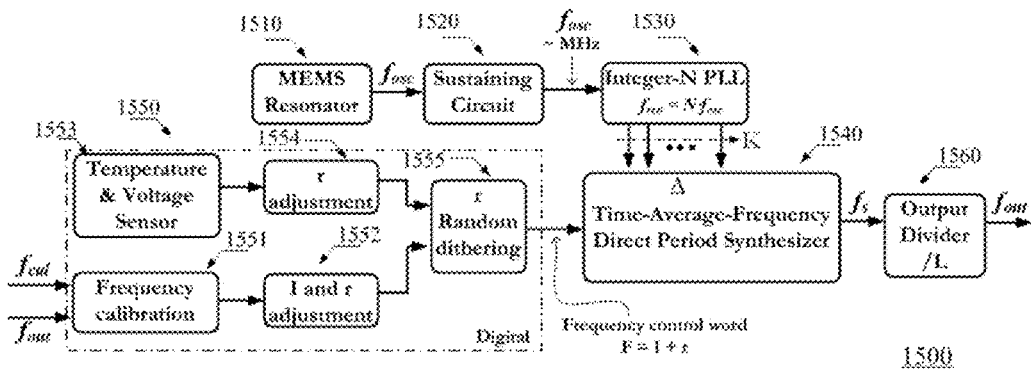
FIG. 15 is an electrical diagram, in block form, showing the working principle of using Time-Average-Frequency direct period synthesizer to compensate a MEMS resonator's temperature-induced and voltage-induced frequency variation, and to correct manufacture-introduced frequency error.

Referring now to FIG. 15, the principle of using present invention to improve a MEMS resonator based oscillator's frequency quality will be described. A MEMS resonator 1510 is used to create mechanical vibration at a frequency $f_{osc}$ (usually in ~MHz range). Its output is fed to a sustaining circuit 1520 which converts the mechanical vibration into electrical pulse. Sustaining circuit 1520 also plays a role of sustaining the MEMS resonator's vibration. Its output is fed to an integer-N PLL 1530 as its reference frequency. As a result, the PLL 1530 has an output frequency $f_{vco}=N \cdot f_{osc}$ where N is an integer and is the PLL dividing ratio. The PLL has a multiple-stage VCO that produces K outputs. Consequently, the base time unit is $\Delta=T_{VCO}/N=1/(K \cdot N \cdot f_{osc})$. These K outputs, and thus the base time unit A, are sent to a Time-Average-Frequency Direct Period Synthesizer 1540. Its output of frequency f is fed to a post divider with ratio L. The final output has a frequency $f_{out}=f_s/L=1/(L \cdot F \cdot \Delta)$ where F=I+r is the frequency control word of the synthesizer 1540.

Compensation and calibration circuit 1550 has a temperature sensor 1553. Its output is compared against a frequency-vs.-temperature table. The corresponding frequency adjustment is captured in the frequency control word's fraction part r by circuit 1554. The working principle is described as follows. MEMS resonator's vibration frequency varies with the temperature change of its surrounding environment. This fact can be expressed as df/f=func(dT) where dT is the temperature change and df/f is the corresponding frequency change. This dependence can be captured in a table after the MEMS resonator is manufactured and calibrated. In operation, after temperature change dT is reported from the temperature sensor, the corresponding df/f can be available by checking the table. From equation (4), the required r adjustment to counteract the df/f can be calculated as dr=I·(df/f). Note that, in equation (4), there is a negative sign in df/f vs. dr relationship. This is because of the reason that the synthesizer's output frequency is inversely proportional to the control word as shown in (3). In current calculation of dr=I·(df/f), the negative sign is not presented since we want the frequency adjustment to be in the opposite direction so that the resulting frequency adjustment will cancel the temperature-induced df/f and make the output frequency stable. In operation, the temperature is monitored in a predetermined schedule. For example, the sensor output can be checked in every second, or every millisecond, or even every microsecond. Thus, each time, the value of dT is usually small. The corresponding df/f is small as well (<tens ppm). The synthesizer is designed in such way that the frequency control word's integer part I is a relatively large number (>16). It is expected that the required dr will be small. This will make equation (4) true.

A numerical example is provided as follows. Assume that the temperature sensor output is checked in very microsecond. At one such checking operation, the dT reading is 1° C. By referencing the frequency-vs.-temperature table, it is found that the MEMS resonator's frequency variation caused by this 1° C. temperature change is 5 ppm. Also assume that the integer part of the frequency control word is I=24. Therefore, the required dr adjustment to compensate this 5 ppm frequency variation is dr=I·(df/f)=24*5e−6=0.00012. Circuit 1550 also can have a voltage sensor to sense the change in power supply voltage. Similarly, the corresponding required frequency adjustment can be captured in r as well.

Circuit 1550 further contains a frequency calibration circuit 1551. By comparing the $f_{out}$ with an external reference frequency $f_{cal}$, the corresponding frequency correction can be captured in F=I+r by circuit 1552. The goal is to make $f_{out} \alpha \cdot f_{cal}$ where $\alpha$ is a constant chosen by user. The working principle can be described as follows. Before calibration, assume that the synthesizer's frequency control word is $F_0$ and the $f_{out}$ takes the value of $f_0=1/(F_0 \cdot \Delta)$. By dividing $f_{out}$ with a divider of ratio Q, a new frequency $f_{0\_Q}=f_0/Q=1/(Q \cdot F_0 \cdot \Delta)$ is derived. This signal of $f_{0\_Q}$ is then used to count the external frequency signal of $f_{cal}$, resulting in $f_{cal}=P \cdot f_{0\_Q}$ where P is the counter output and is an integer. If the calibration target is to make $f_{out}$ take the value of $f_{des}=\alpha \cdot f_{cal}$, then the corresponding new frequency control word $F_b$ can be derived from $f_{des}=1/(F_b \cdot \Delta)$. Therefore, $F_b=I_b+r_b=F_0 \cdot (Q/P) \cdot (f_{cal}/f_{des})= F_0 \cdot (Q/P)/\alpha$ is the desired frequency control word after the calibration. It can correct the frequency offset introduced in the manufacture process.

A numerical example is provided as follows. Assume a MEMS resonator based frequency source as shown in FIG. 15 is designed. Its target for $f_{out}$ is 27 MHz. An accurate 27 MHz external reference is provided for calibration ($\alpha=1$ in this case). After manufacture, the MEMS frequency source is expected to operate at a fixed frequency. The target frequency for the MEMS is known (27 MHz in this case), but its precise value is unknown due to the imperfection in the manufacture process. As explained before, a base time unit A can be derived from this MEMS frequency. Its precise value is unknown but can be estimated from the target MEMS frequency. The synthesizer's frequency control word can be initially set at $F_0=24$ (from the estimated $\Delta$ value) to make $f_{out}$ in the neighborhood of $f_0 \approx 27$ MHz. A divider of ratio Q=1024 is used to generate a signal at frequency $f_{0\_Q} \approx 27$ MHz/1024≈26.37 KHz. The precise 27 MHz calibration signal is used as the clock to count this 26 KHz divided down signal, resulting in a counter output P. This is achieved by counting the number of calibration signal pulses within one cycle of the divided down signal. If P=1023, then the new frequency control word can be derived as $F_b=I_b+r_b=F_0 \cdot (Q/P)/\alpha=24*1024/1023=24.02346041$ ($I_b=24$ and $r_b=0.02346041$). After applying this updated frequency control word, this MEMS frequency source is expected to output a frequency exactly at 27 MHz. From the measured P value, the MEMS resonator's frequency error can also be derived. In this particular example, the error is about 977 ppm.

Optionally, circuit 1553 can also include a random dithering circuit 1555. In Time-Average-Frequency clock pulse train, the pulse type $T_B$ occurs regularly. Its pattern is controlled by the fraction r. Random dithering circuit 1555 can continuously change the r value over a range and make r look like a randomly generated number (but the average equals to the original value). This can randomize the $T_B$ pattern and converted the spurious tones in the frequency spectrum into noise. For one skilled in the art, it can be understood that this is useful for some applications.

Figure 16:
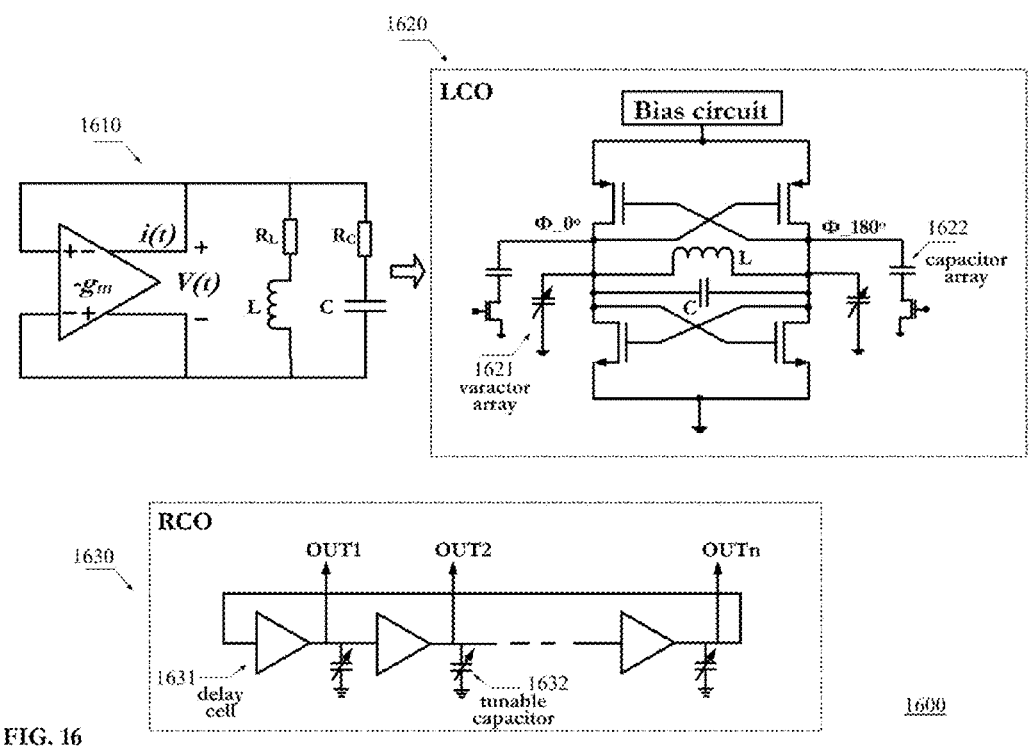
FIG. 16 is an electrical diagram, in block and schematic form, showing the structures of a LCO and a RCO.

Referring to FIG. 16, the working principles of RCO and LCO oscillators will be now described. In block diagram 1610, the drawing illustrates the key components used in a LC oscillator. An inductor and a capacitor form the LC network that can oscillate when appropriate condition is established. Both the inductor and capacitor have their associated parasitic resistors which consume energy. If not compensated, this loss of energy will eventually make the oscillation die out. An operation amplifier is thus included to act as a "negative resistor" that cancels the parasitic resistors. It provides the energy to compensate that lost in resistors so that oscillation can be sustained. LCO circuit 1620 is an exemplary implementation. Its oscillation frequency is determined by LC as $f_{osc}=1/\sqrt{LC}$ where C includes all the capacitors in the circuit. Varactor array 1621 is used for fine tune the oscillation frequency. It can be used to compensate the temperature- and voltage-induced frequency variation. Capacitor array 1622 is used for frequency calibration since larger frequency tune range can be achieved by adjusting the array. The oscillator has two outputs, $\Phi\_0°$ and $\Phi\_180°$, with 180° phase difference between them.

Circuit 1630 is a RCO oscillator. It consists of multiple delay cells 1631 that are connected together as a ring. The oscillation frequency is inversely proportional to the delay of circuit 1631, which is determined by the RC product that the cell has. Tunable capacitor 1632 can be attached to each delay cell and make its RC product programmable. In most cases, the delay cell is constructed in differential fashion. As a result, there are n outputs from a RCO that is made of n/2 delay cells (n is an even number). The time span between any two adjacent outputs is the base time unit $\Delta$.

Figure 17:
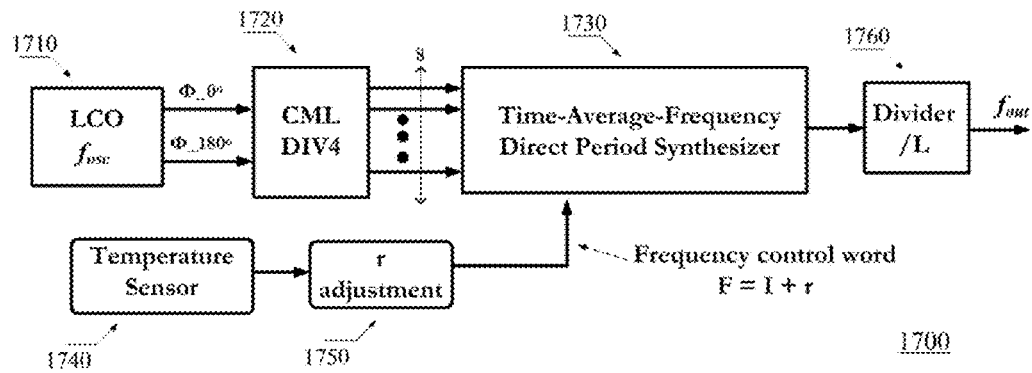
FIG. 17 is an electrical diagram, in block form, showing the working principle of using Time-Average-Frequency direct period synthesizer to compensate a LCO oscillator's temperature-induced frequency variation.

Referring now to FIG. 17, one embodiment of using present invention to improve LCO's frequency stability will be described. A LCO circuit 1710 oscillates at a frequency. It has two outputs, $\Phi\_0°$ and $\Phi\_180°$, which are 180° apart in their phases. These two phases are fed into a differential CML (current mode logic) divider circuit 1720. The divide ratio is 4, resulting in eight outputs that are evenly spaced in time. The time span between any two adjacent outputs is the base time unit $\Delta$. These eight outputs, and thus the base time unit $\Delta$, are fed into a Time-Average-Frequency direct period synthesizer 1730. The output of the synthesizer is fed into a post divider 1760 of ratio L. The divider output is the final output with frequency $f_{out}$. A temperature sensor 1740 is included in the circuit to monitor the environmental temperature. For every specified time frame, for example one second, or one millisecond or one microsecond, a temperature change dT is reported from the sensor. The LCO's frequency dependence on temperature, df/f=func(dT), is captured in a table which is established beforehand. By using this table, the value of df/f can be derived and the corresponding r adjustment dr=1·(df/f) can be calculated using equation (4). The calculation can be carried out in a similar procedure as described previously in the case of MEMS resonator. The circuit 1750 applies the calculated r adjustment to synthesizer 1730. As a result, the corresponding frequency adjustment counteracts the LCO frequency variation caused by the temperature change and makes the output frequency stable. To one skilled in the art, it is clear that similar mechanism can be used to compensate the frequency variation caused by power supply voltage change. Furthermore, the similar procedure used in the frequency calibration for MEMS resonator can be used for the frequency calibration of LCO to correct the frequency error introduced in the manufacture process. It is also worth to note that the dividing ratio of 4 (and the resulting 8 outputs) is just an example. Other ratios (and corresponding number of outputs) can be used as well.

Figure 18:
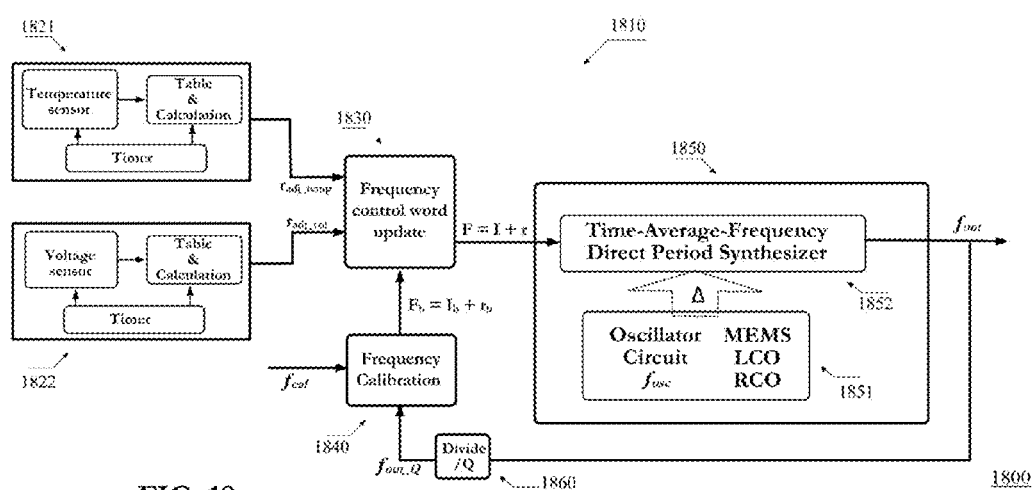
FIG. 18 is an electrical diagram, in block form, showing the working principle of using Time-Average-Frequency direct period synthesizer to stabilize crystal-less frequency generator's frequency stability.

FIG. 18 shows the present invention of a crystal-less frequency generator system 1810 in the form of block diagram. A crystal-less clock circuit 1850 is used to create an output signal with a stable frequency $f_{out}$ that is not varied with temperature and supply voltage changes. It is also tuned at the desired frequency. Inside circuit 1850, an oscillator circuit 1851 is presented to create the electrical switching activity at a frequency of $f_{osc}$. Oscillator circuit 1851 can be MEMS resonator, LCO or RCO as described in previous context. The frequency $f_{osc}$ could be affected by temperature and supply voltage changes. It is also possible that $f_{osc}$ is not at desired frequency due to the imperfection in manufacture process. Oscillator circuit 1851 has multiple equally-spaced-in-phase outputs that are fed to Time-Average-Frequency direct period synthesizer circuit 1852. The time span between any two adjacent such outputs is the base time unit $\Delta$. The output frequency of the synthesizer circuit 1852 is $f_{out}$.

Crystal-less frequency generator system 1810 includes a temperature sensor subsystem 1821 and a voltage sensor subsystem 1822. The temperature sensor subsystem 1821 has a temperature sensor circuit, a timer circuit and a circuit that contains a frequency-vs.-temperature table and does the corresponding calculation to derive the required frequency control word adjustment $r_{adj\_temp}$. The operation is controlled by the timer. The voltage sensor subsystem 1822 has a voltage sensor circuit, a timer circuit and a circuit that contains a frequency-vs.-voltage table and does the corresponding calculation to derive the required frequency control word adjustment $r_{adj\_vol}$. The operation is also controlled by its timer.

Crystal-less frequency generator system 1810 further includes a frequency calibration circuit 1840 and a divider circuit 1860 with dividing ratio Q. The output of the divider is at frequency $f_{out\_Q}=f_{out}/Q$. Calibration circuit 1840 has two input signals with frequency of $f_{cal}$ and $f_{out\_Q}$, respectively. Signal of frequency $f_{cal}$ is provided from outside the system 1810 and has high accuracy. It is used to calibrate the system 1810 so that its output can be tuned to the desired frequency. Calibration circuit 1840 has one output that sets the base frequency control word $F_b=I_b+r_b$.

Crystal-less frequency generator system 1810 still includes a frequency control word update circuit 1830. It has three inputs that are connected to the outputs of the temperature sensor subsystem 1821, the voltage sensor subsystem 1822 and the frequency calibration circuit 1840 as illustrated in FIG. 18. It has one output that is the frequency control word F=I+r. This frequency control word is originated from the base frequency control word $F_b=I_b+r_b$ and it includes the calculated adjustments to compensate the temperature- and voltage-induced frequency variation.

Figure 19:
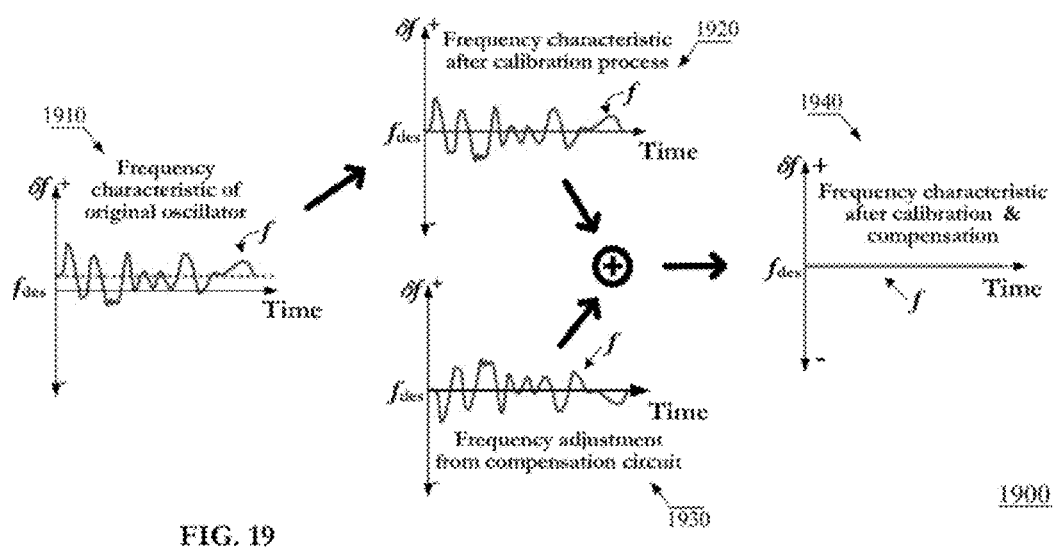
FIG. 19 is a diagram showing the steps of using Time-Average-Frequency direct period synthesizer to stabilize crystal-less frequency generator's output frequency.

Referring now to FIG. 19, the flow of improving crystal-less oscillator's frequency stability will be explained. Plot 1910 illustrates the frequency characteristic of the original crystal-less oscillator. It is possible that the output frequency is inaccurate and unstable. Plot 1920 depicts the frequency characteristic after the calibration process. As shown, the frequency error has been corrected. However, the output frequency still is not stable. The temperature and voltage compensation process will add frequency control word adjustment to counteract the frequency variation. The corresponding frequency adjustment provided by this compensation process is illustrated in plot 1930. After the frequency calibration and frequency compensation, the frequency characteristic of the crystal-less frequency generator system is shown in plot 1940. The output frequency is expected to be stable and accurate.

Figure 20:
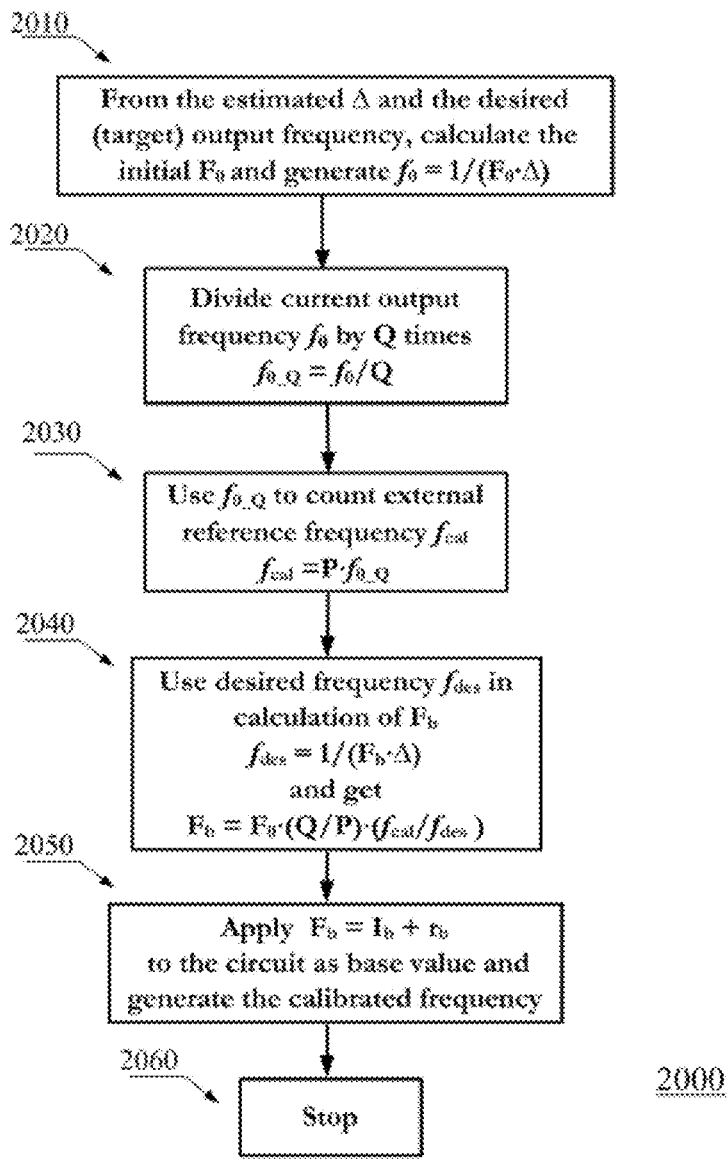
FIG. 20 is a flowchart showing the sequence of actions in the frequency calibration process.

Referring to FIG. 20, the flow of frequency calibration process now will be explained. The process starts from step 2010. From the estimated $\Delta$ and the desired (target) frequency, the initial frequency control word $F_0$ is calculated. The Time-Average-Frequency direct period synthesizer outputs a signal at frequency $f_0=1/(F_0\cdot\Delta)$ where $F_0$ is the initial frequency control word. In step 2020, this signal is then divided down by a divider of ratio Q, resulting in a signal at frequency $f_{0\_Q}=f_0/Q$. In step 2030, one cycle of the signal of frequency $f_{0\_Q}$ is used to count the number of pulses of an externally provided signal with accurate frequency $f_{cal}$. The system is controlled in such a way that $f_{0\_Q}\ll f_{cal}$ so that high resolution can be achieved. The result from this counting process is an integer P which indicates the relationship of $f_{cal}=P\cdot f_{0\_Q}$. In next step 2040, the desired frequency $f_{des}$ is included in the calculation and the corresponding frequency control word $F_b$ is calculated using $f_{des}=1/(F_b\cdot\Delta)$. This results in $F_b=I_b+r_b=F_0\cdot(Q/P)\cdot(f_{cal}/f_{des})$, where $F_0$, Q, P, $f_{cal}$ and $f_{des}$ all are known values. Step 2050 applies the $F_b$ into the frequency control word update circuit and generates the calibrated frequency.

Figure 21:
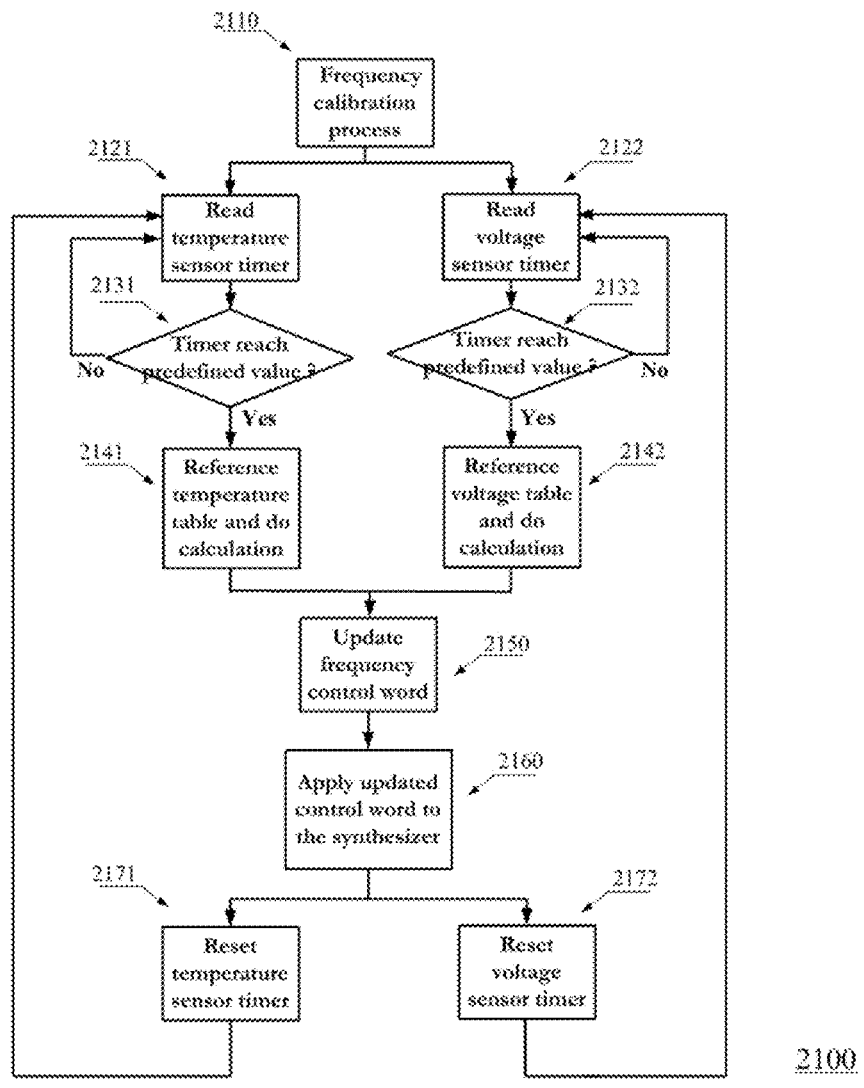
FIG. 21 is a flowchart showing the sequence of actions in the process of using Time-Average-Frequency direct period synthesizer to stabilize crystal-less frequency generator's frequency.
Figure 1:
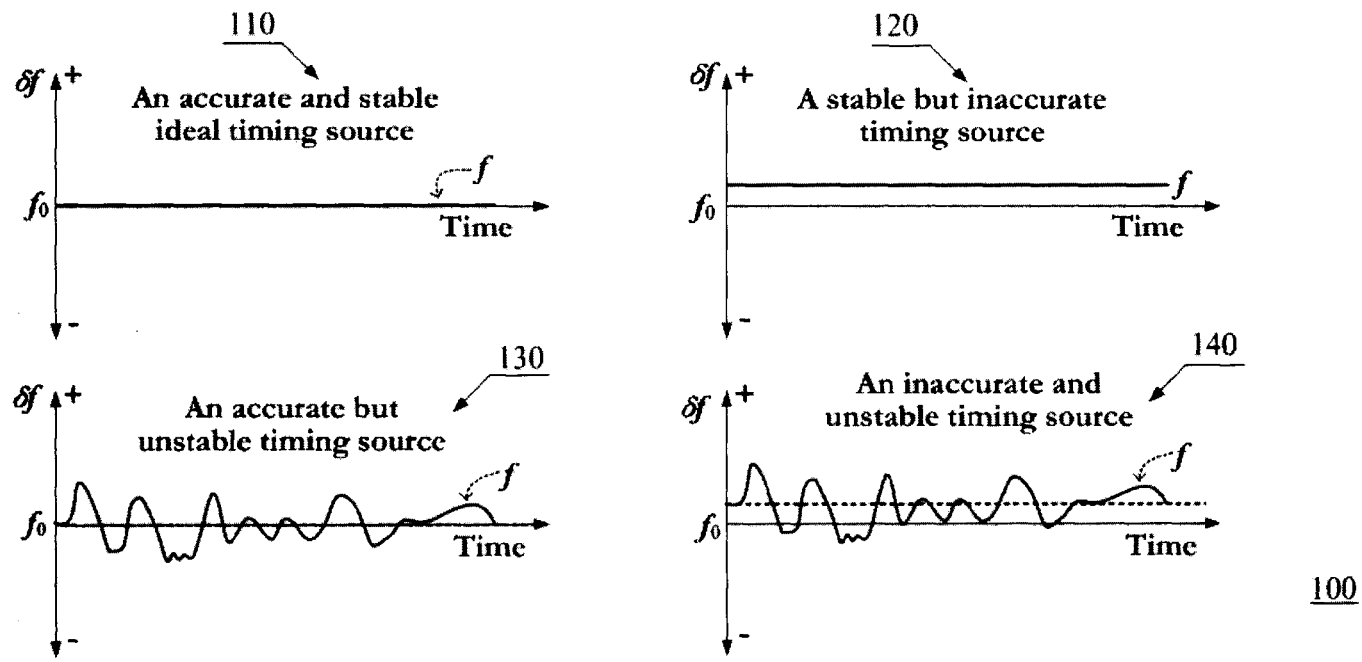
Figure 2:
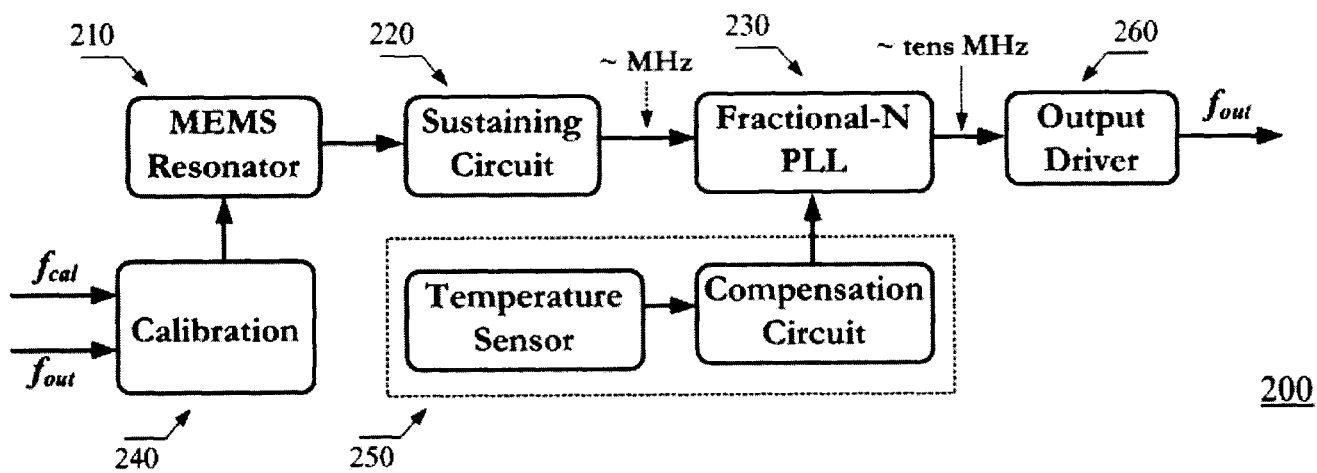
Figure 3:
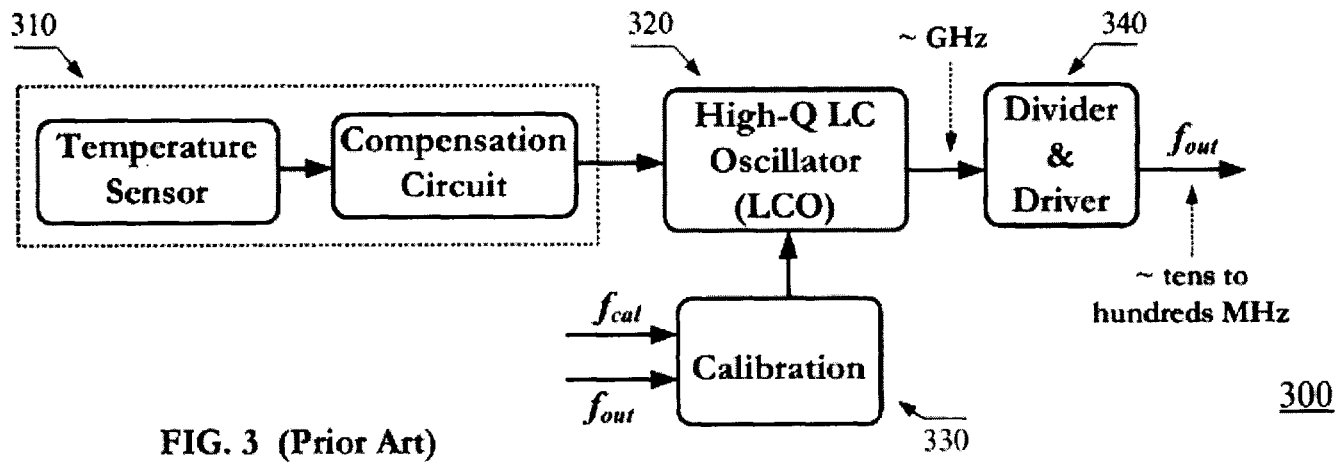
Figure 4:
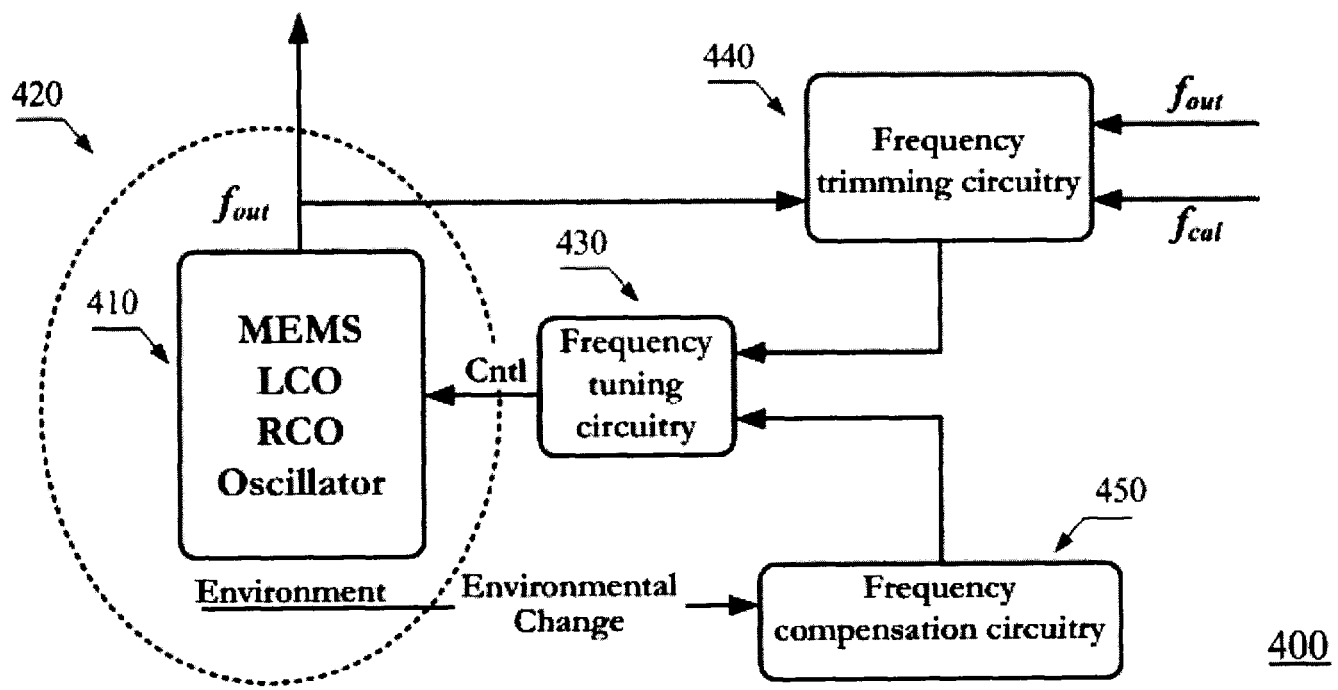
Figure 5:
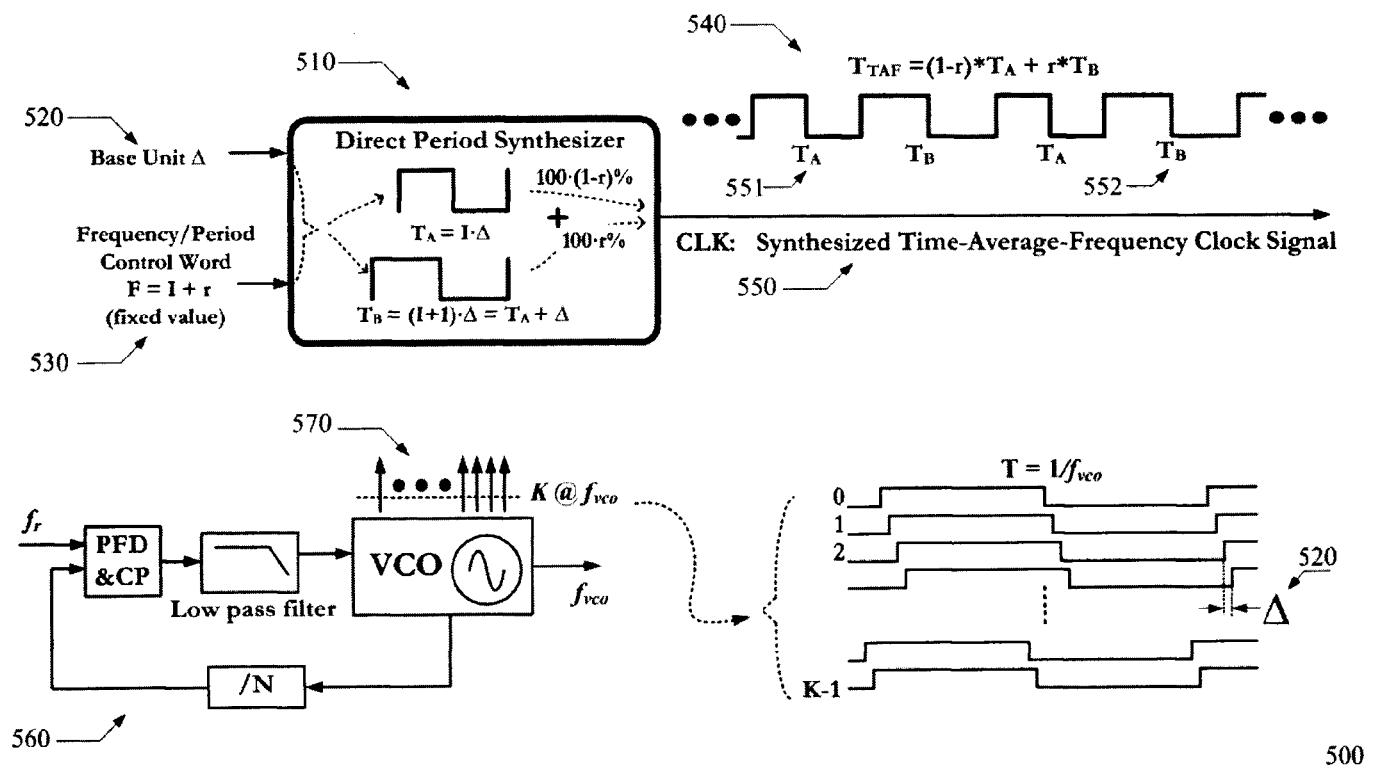
Figure 6:
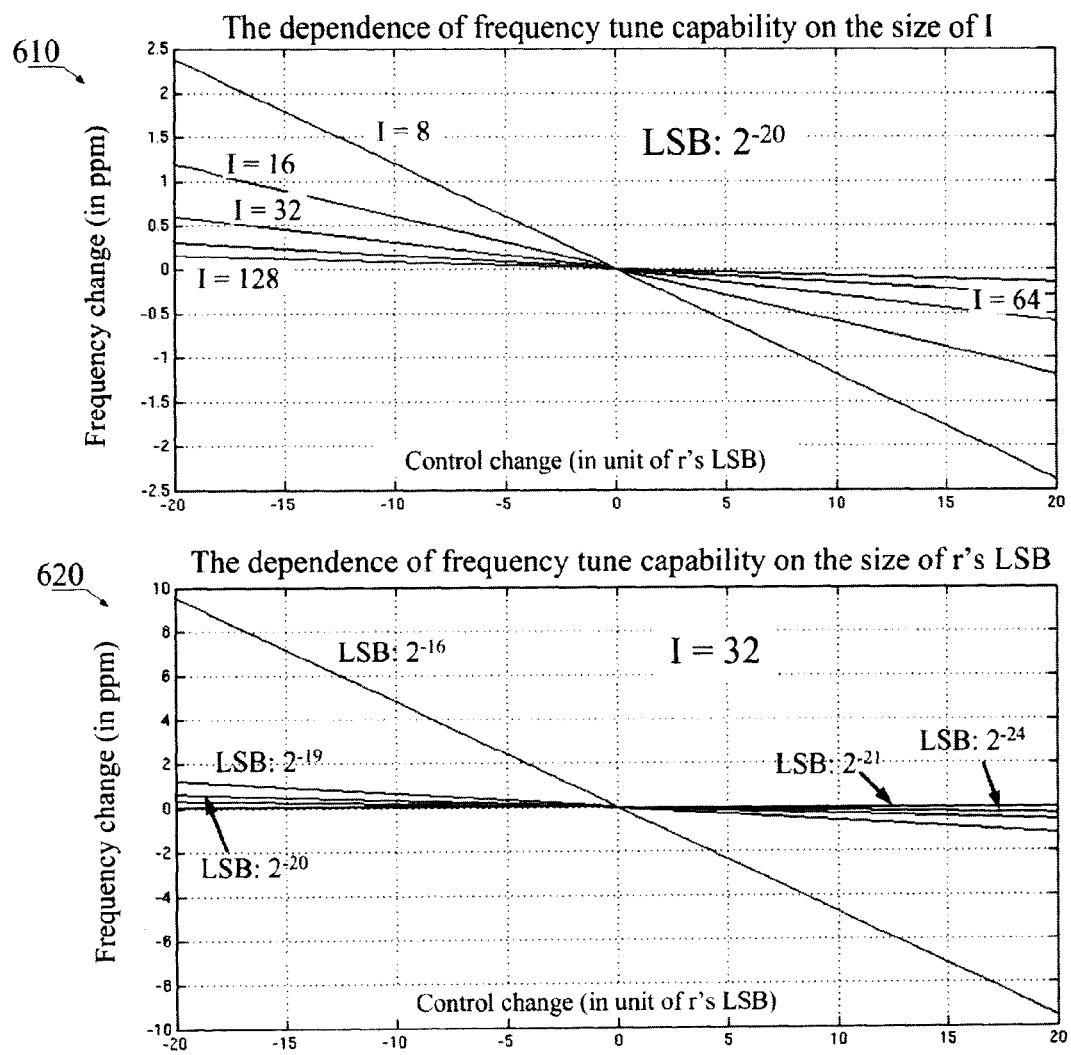
Figure 7:
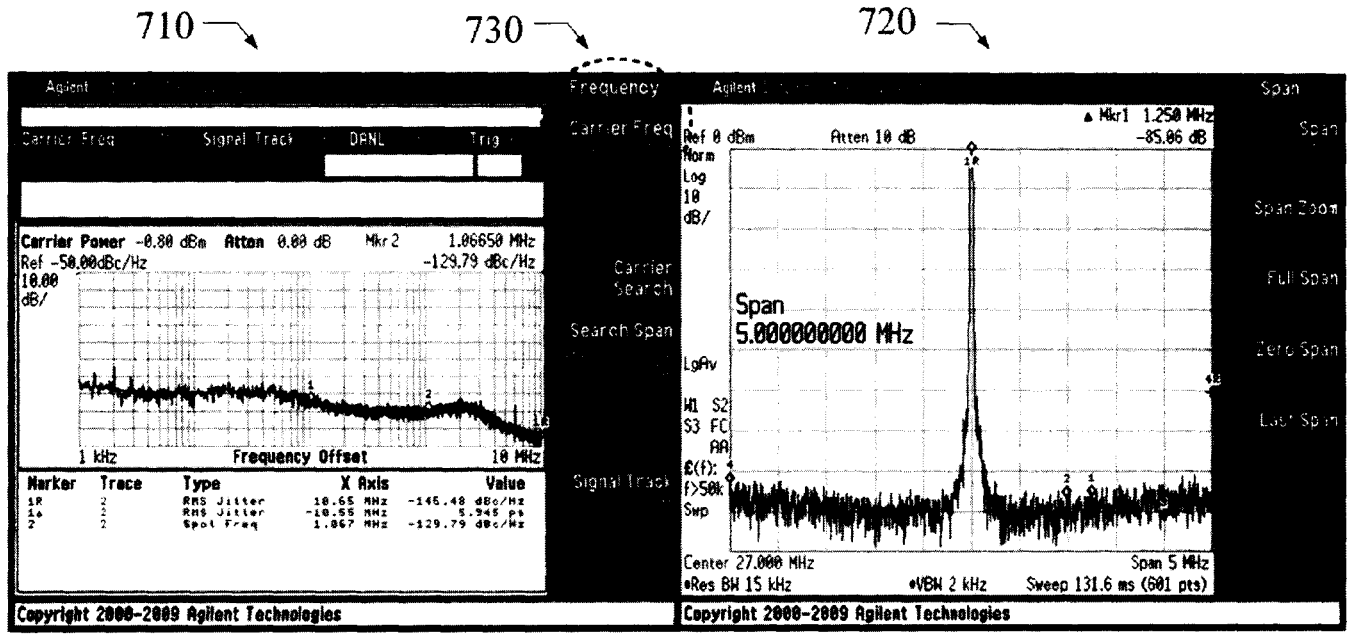
Figure 8:
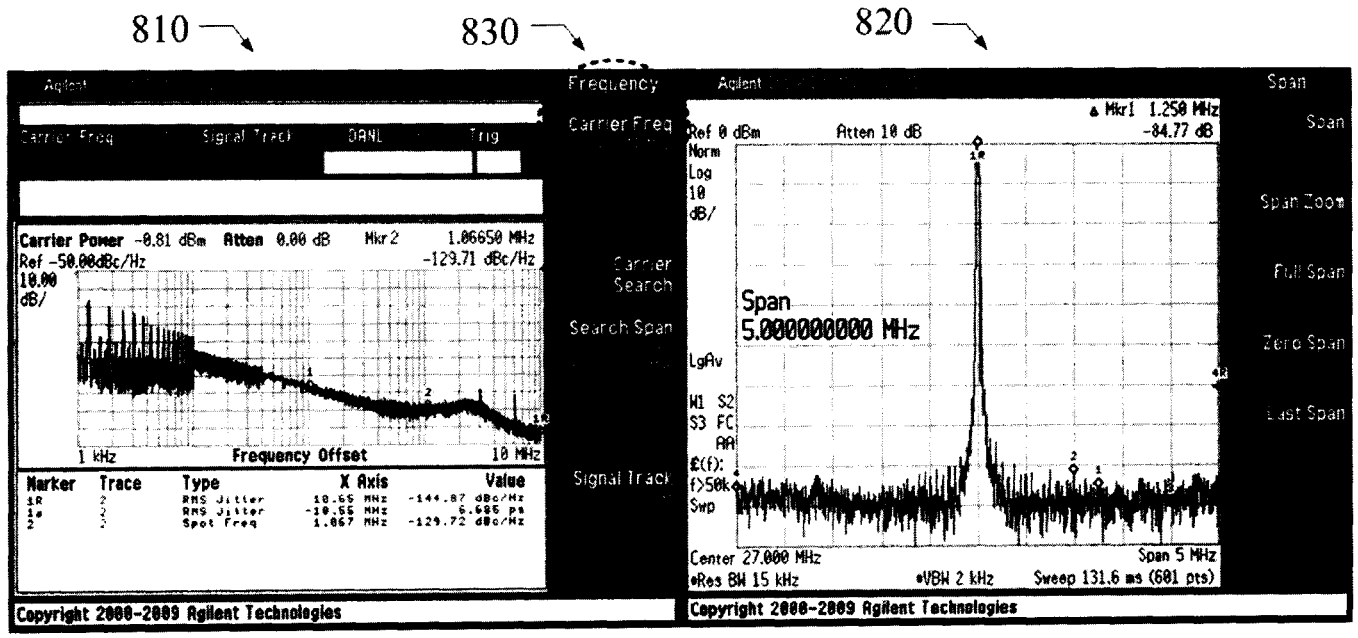
Figure 9:
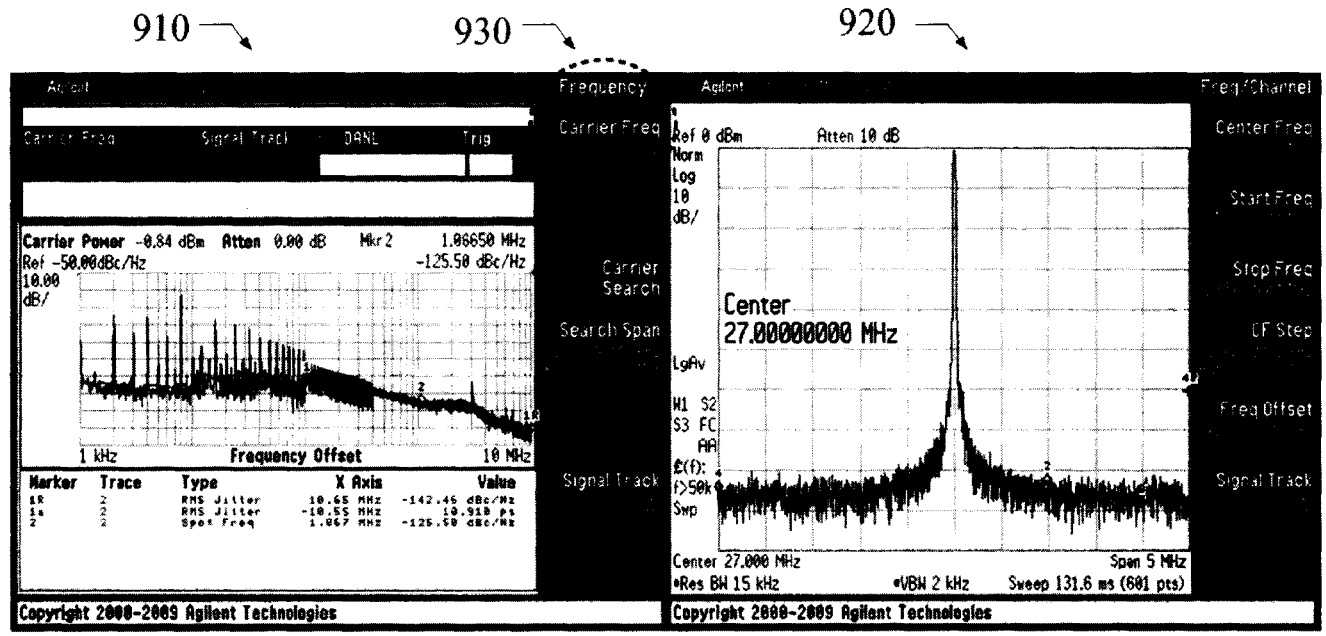
Figure 10:
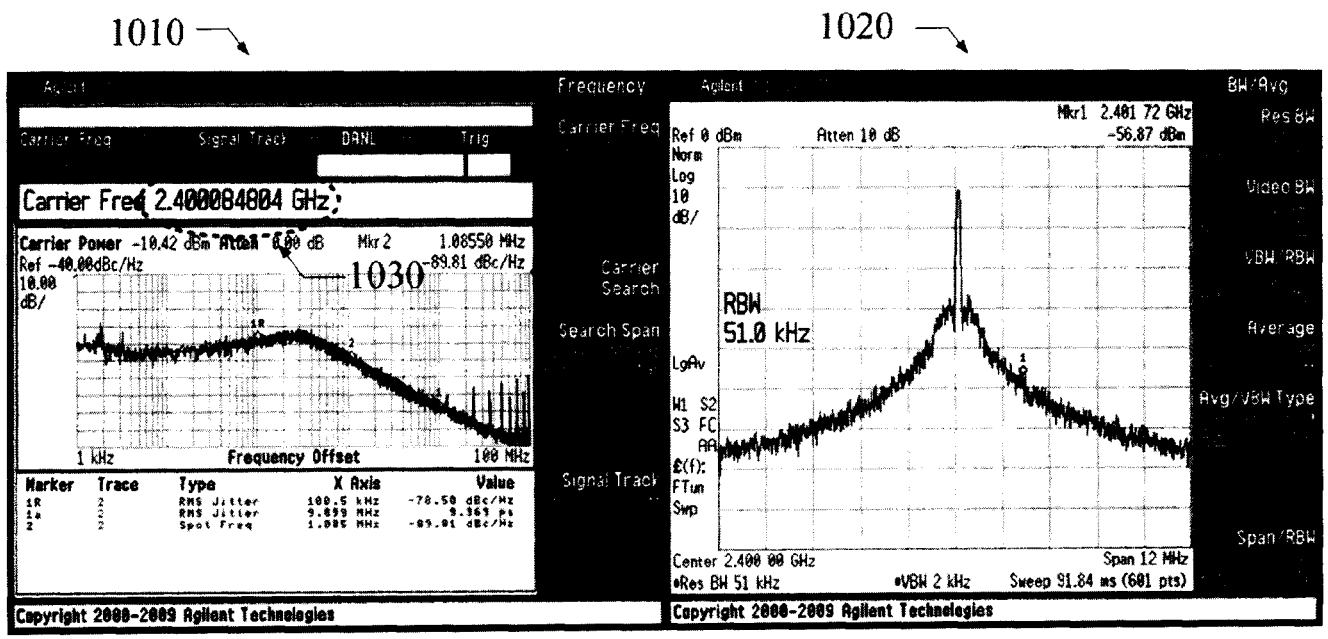
Figure 11:
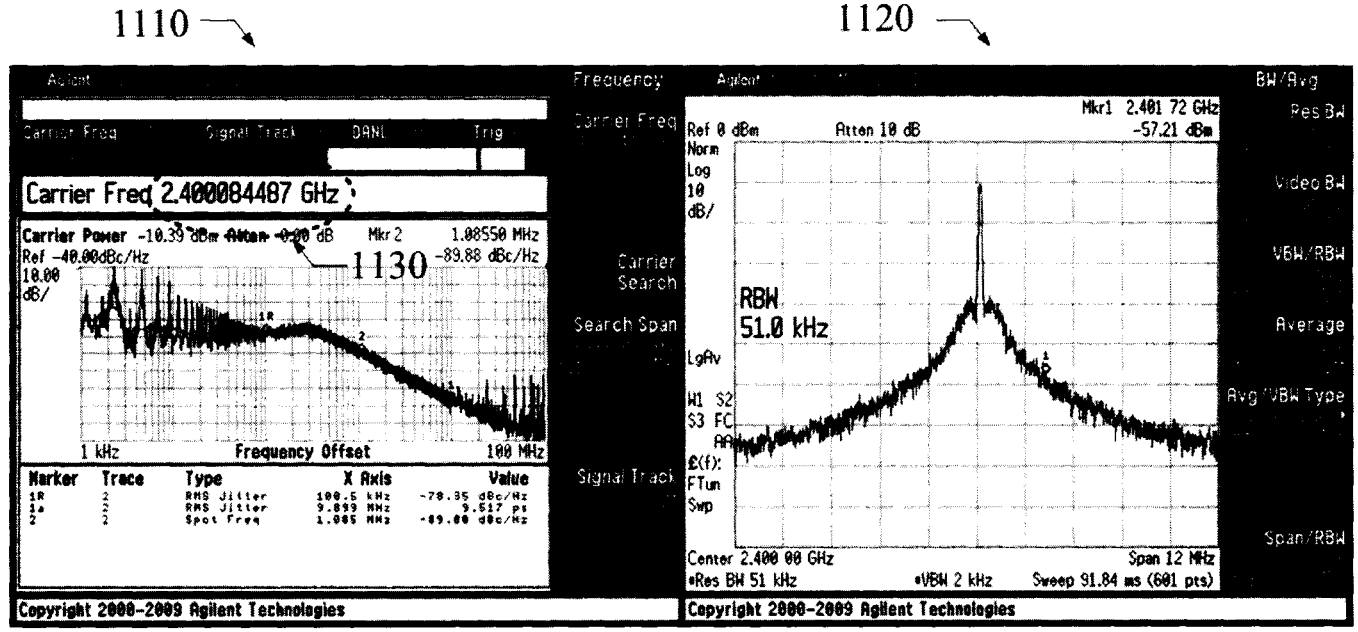
Figure 12:
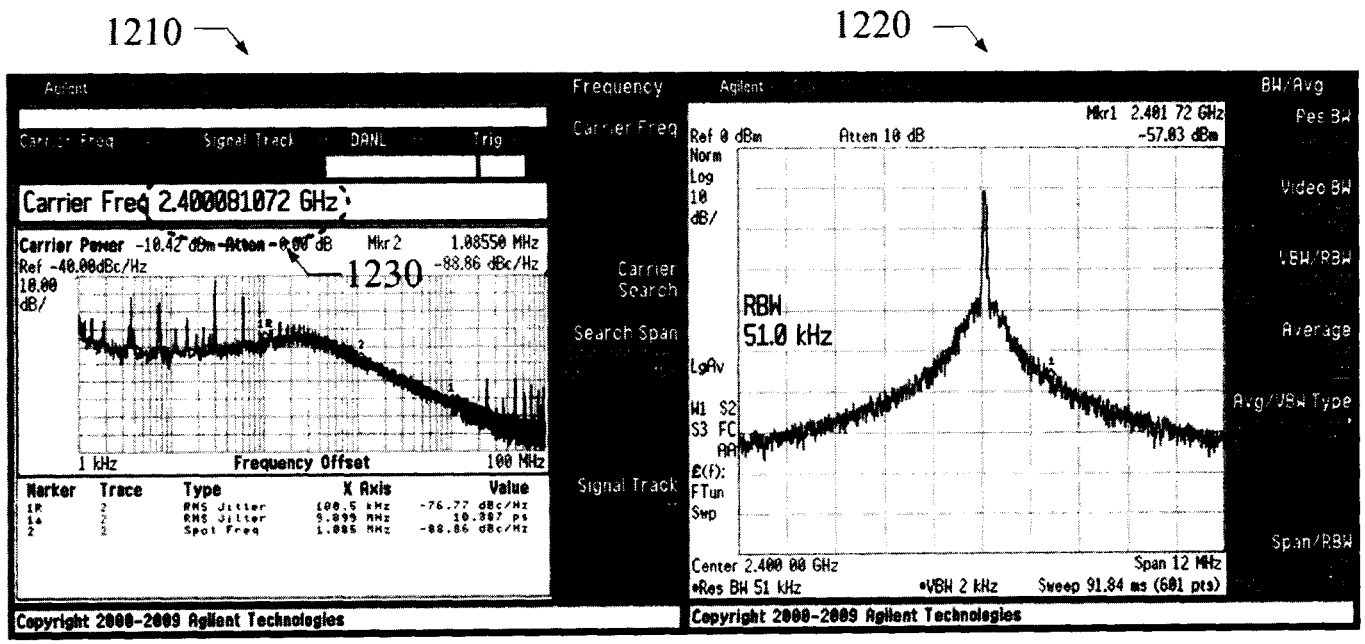
Figure 13:
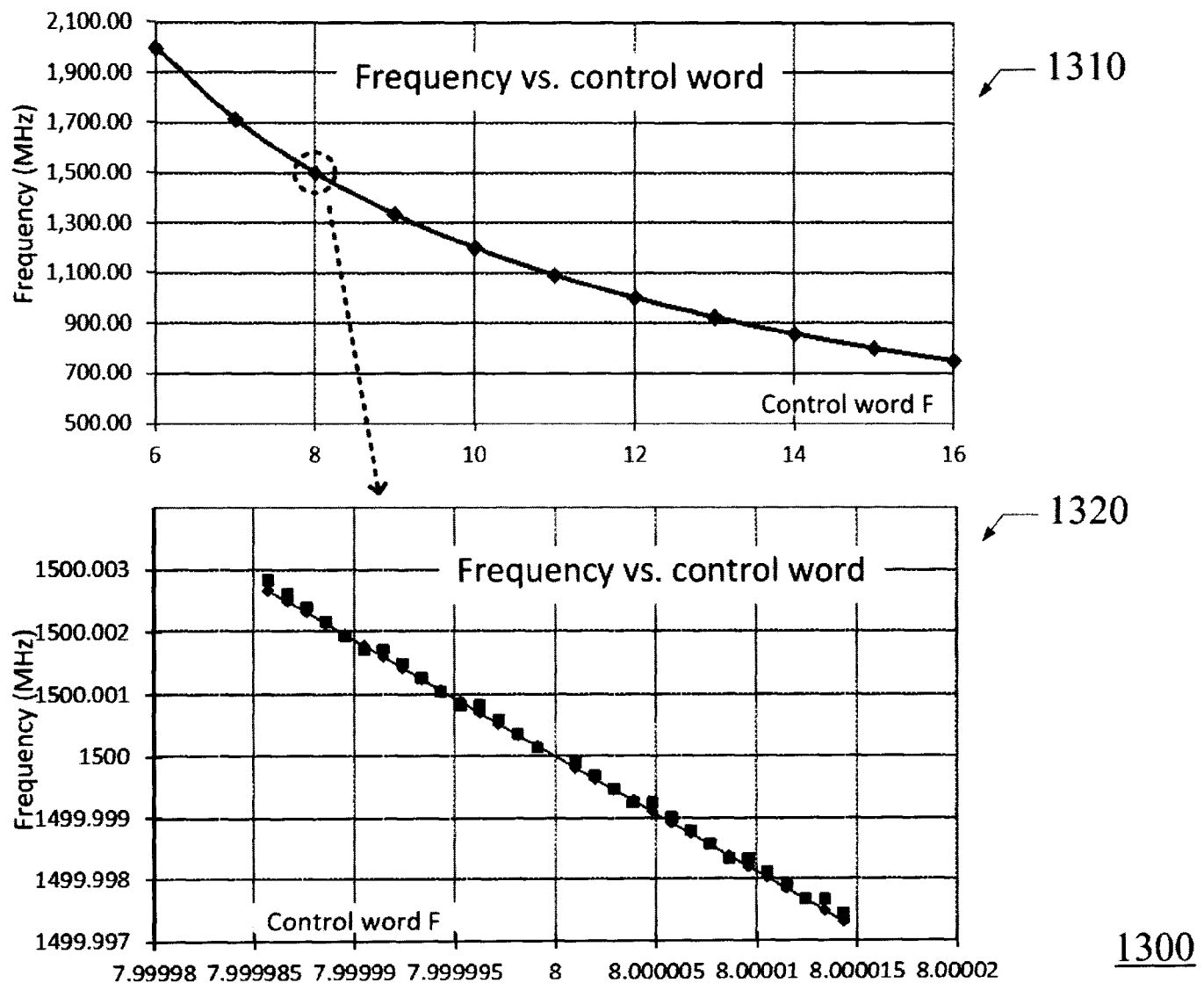
Figure 14:
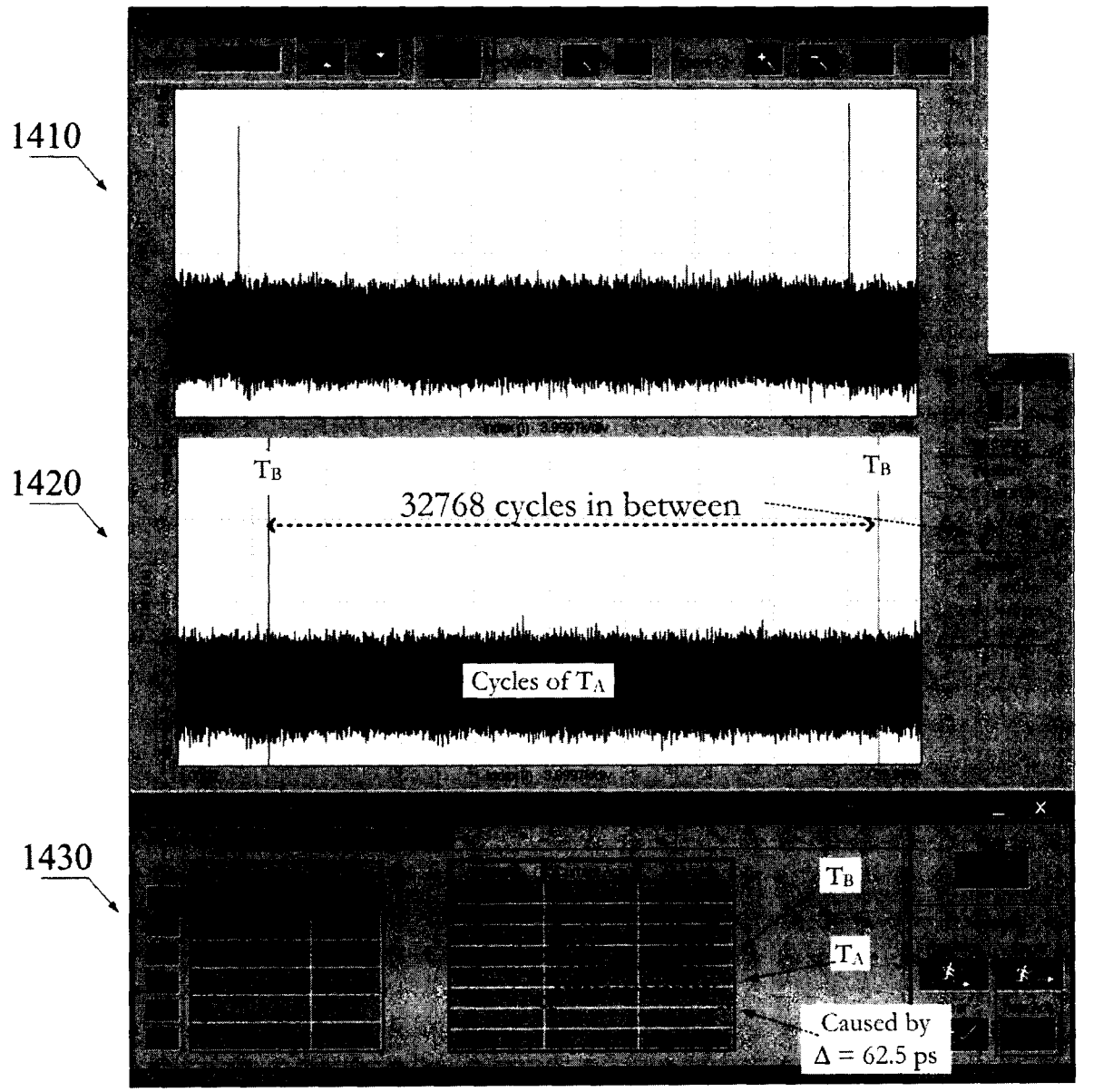
Figure 15:
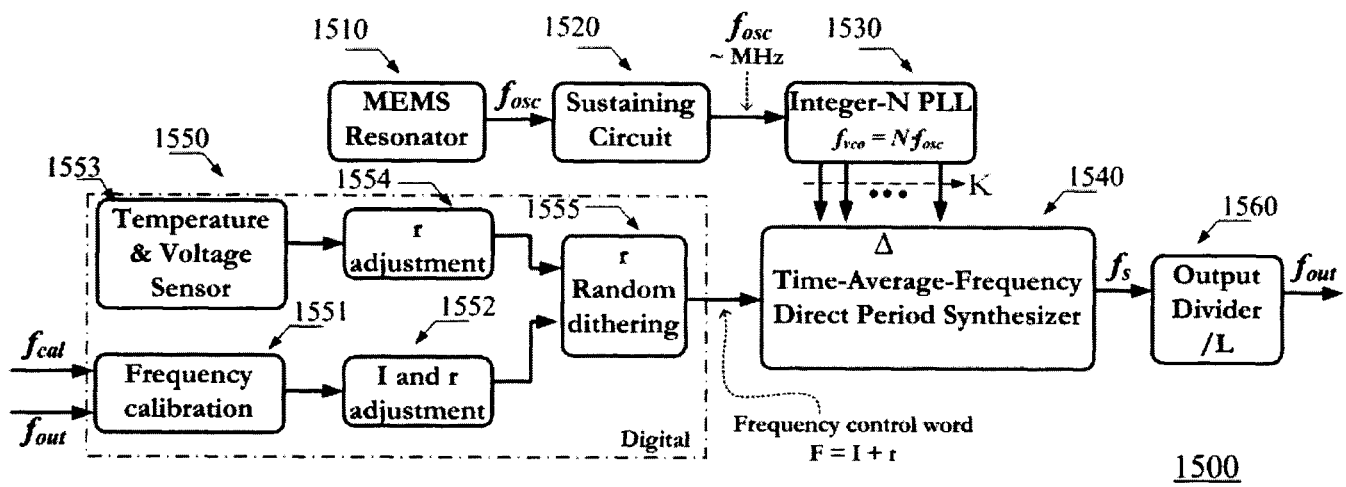
Figure 16:
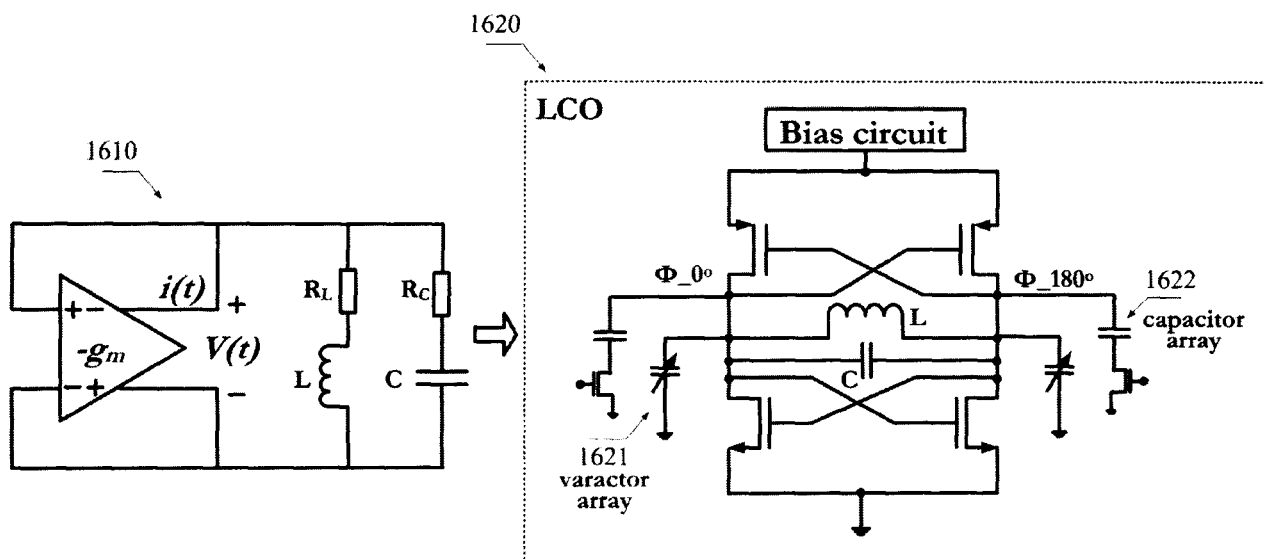
Figure 16:
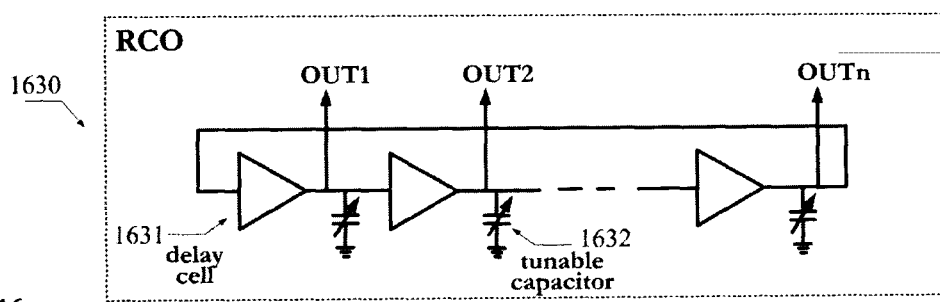
Figure 17:
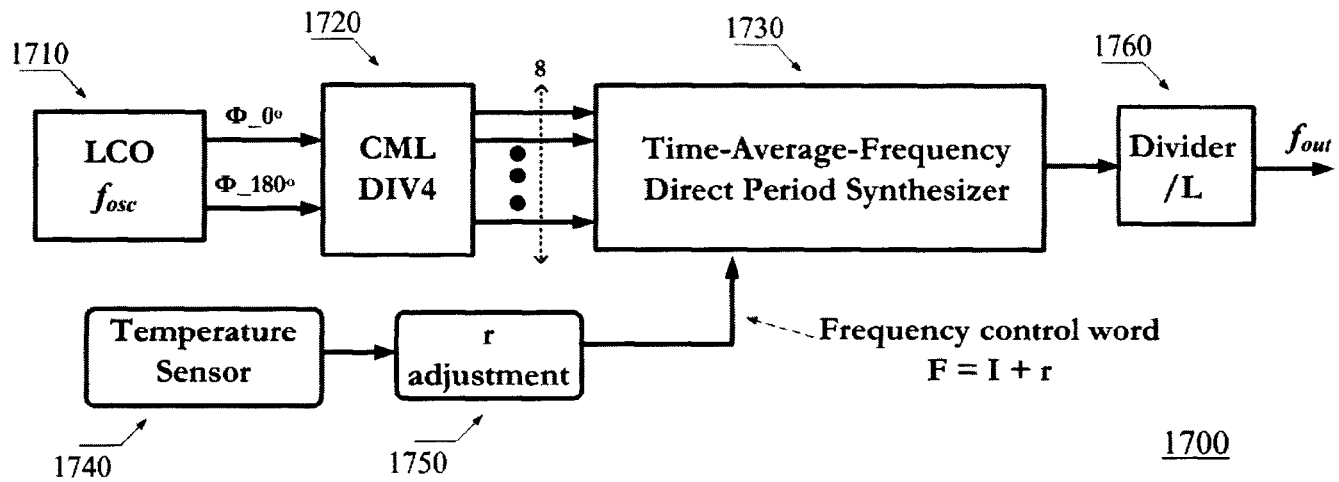
Figure 18:
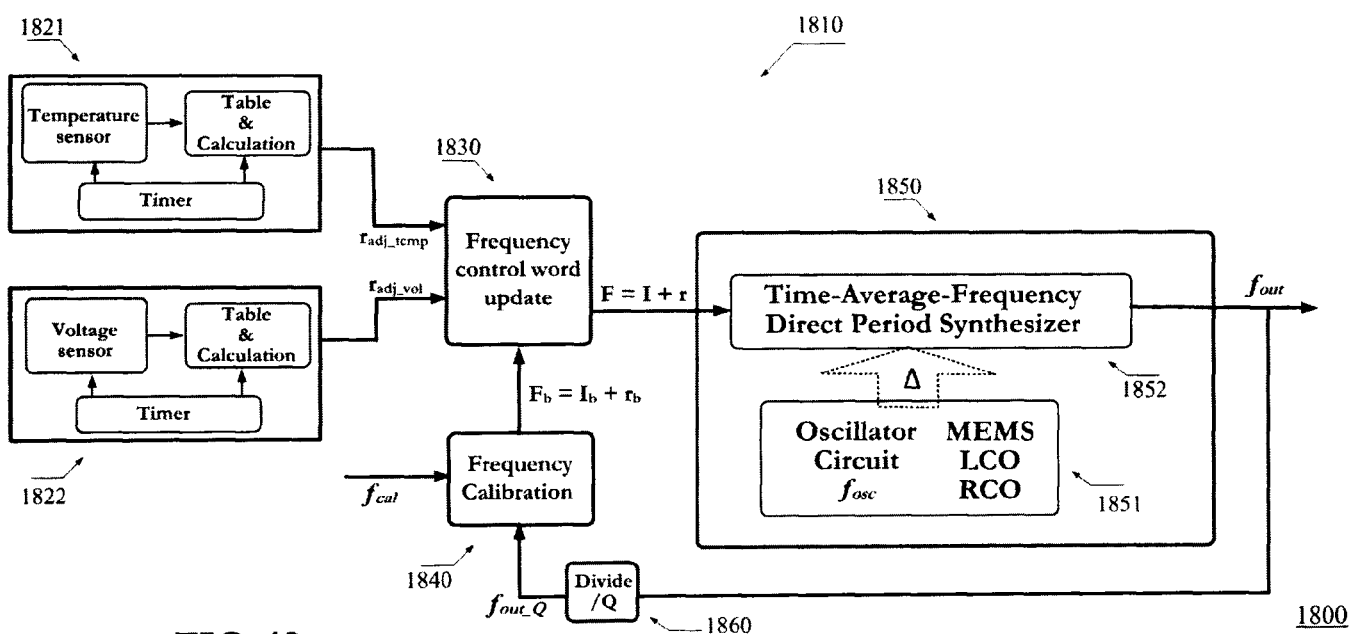
Figure 19:
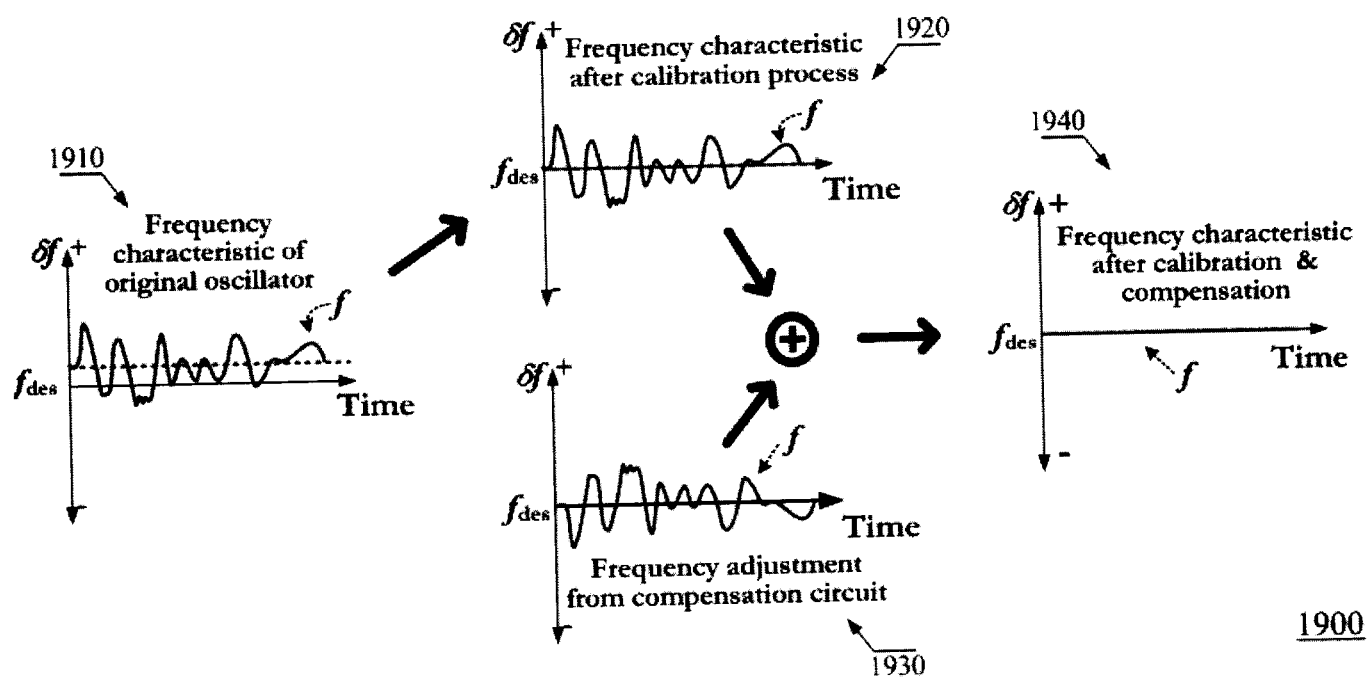
Figure 20:
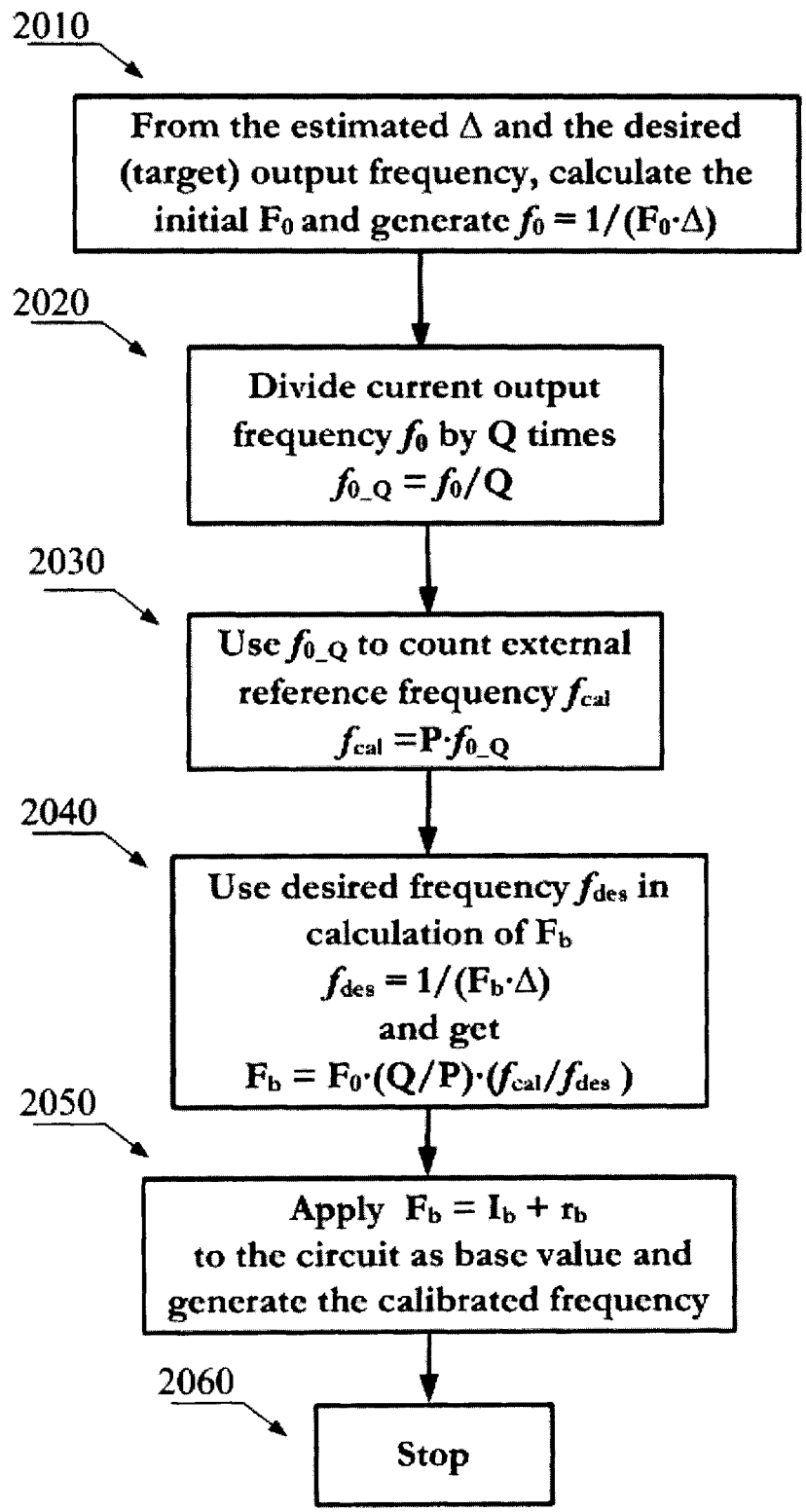
Figure 21:
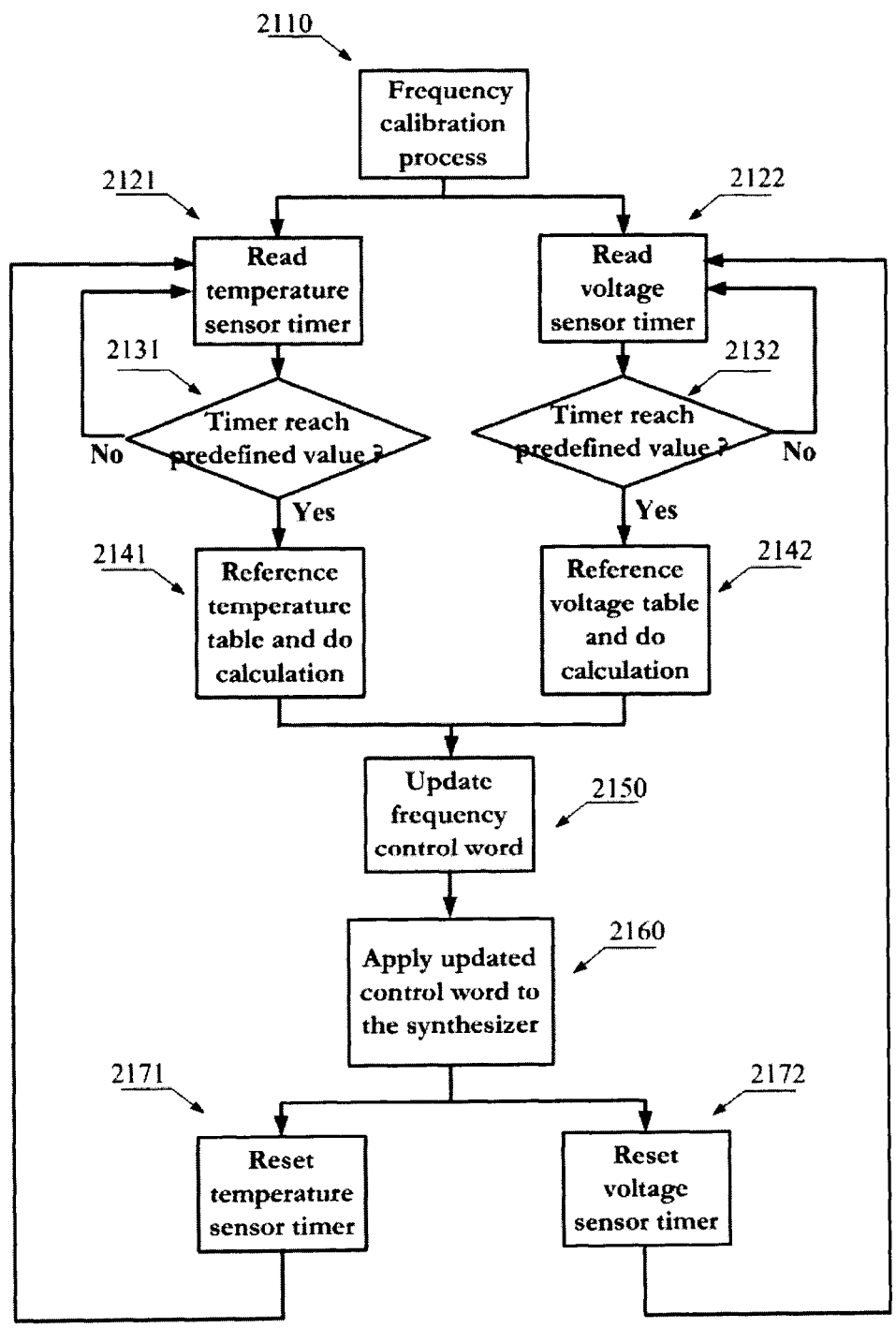
Figure 1:
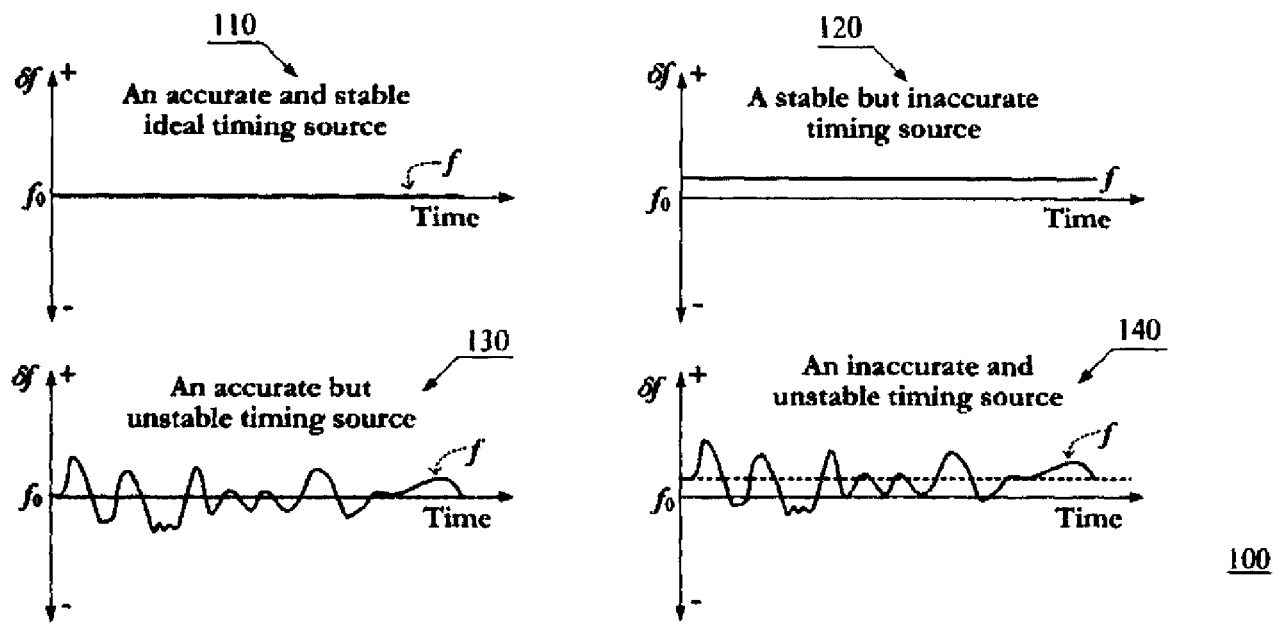
Figure 2:
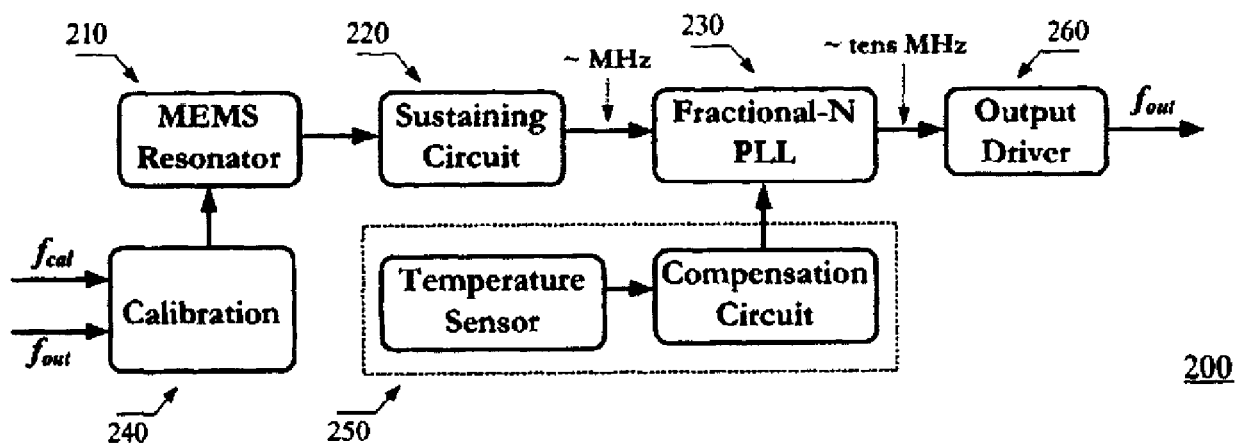
Figure 3:
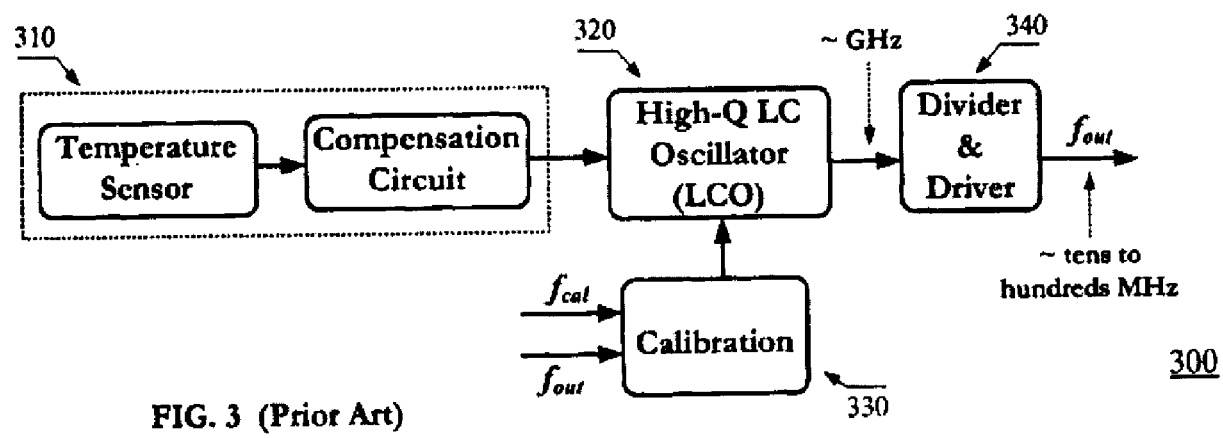
Figure 4:
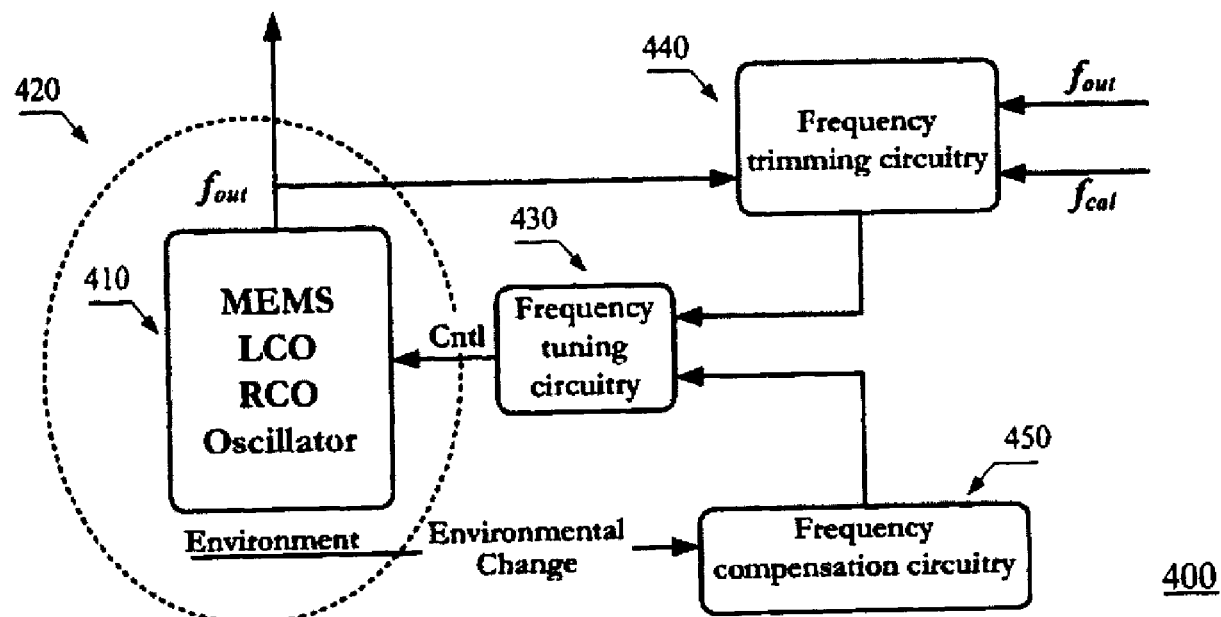
Figure 5:
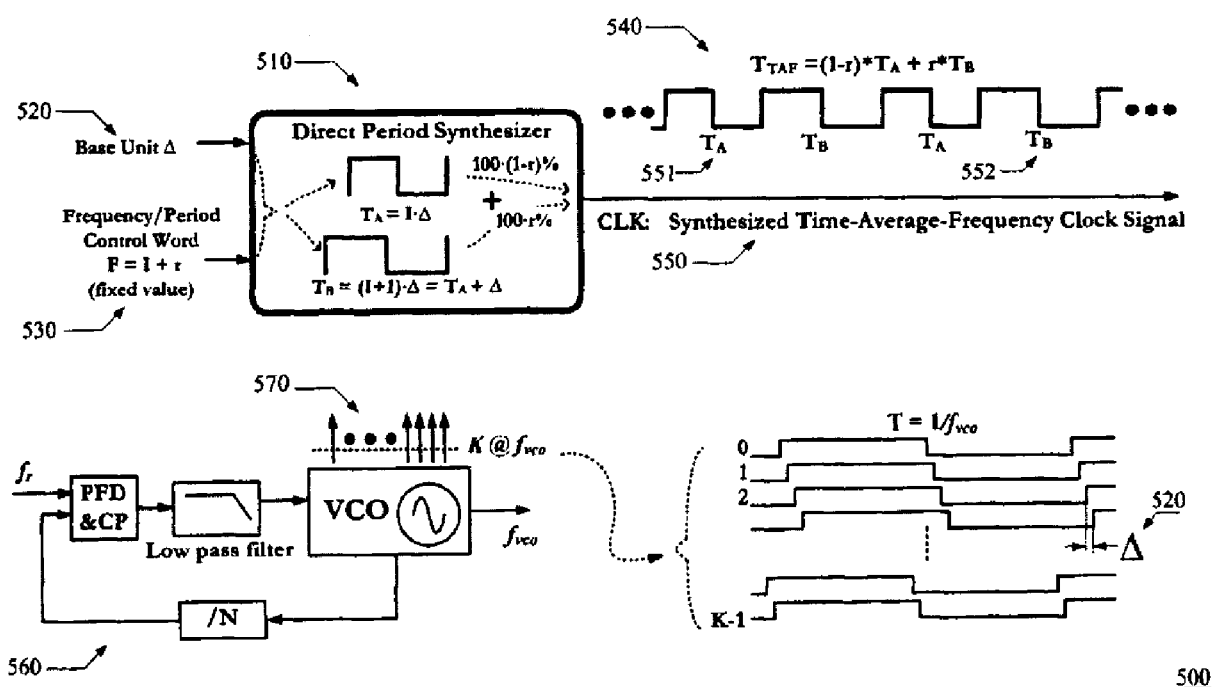
Figure 6:
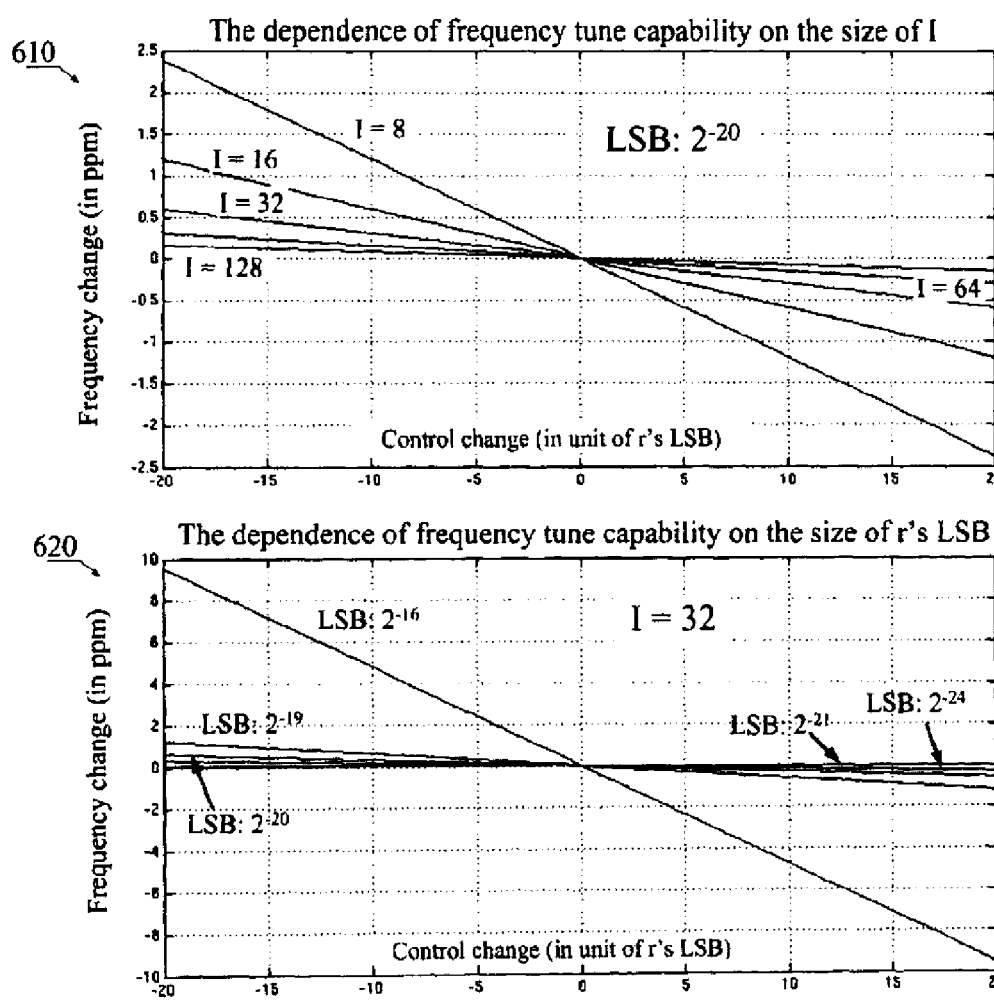
Figure 7:
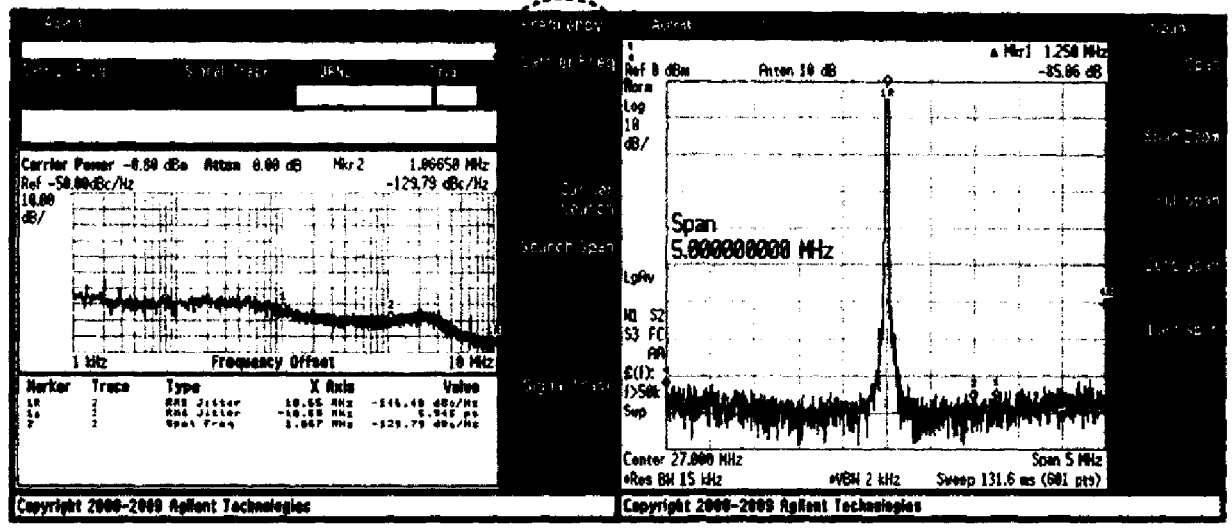
Figure 8:
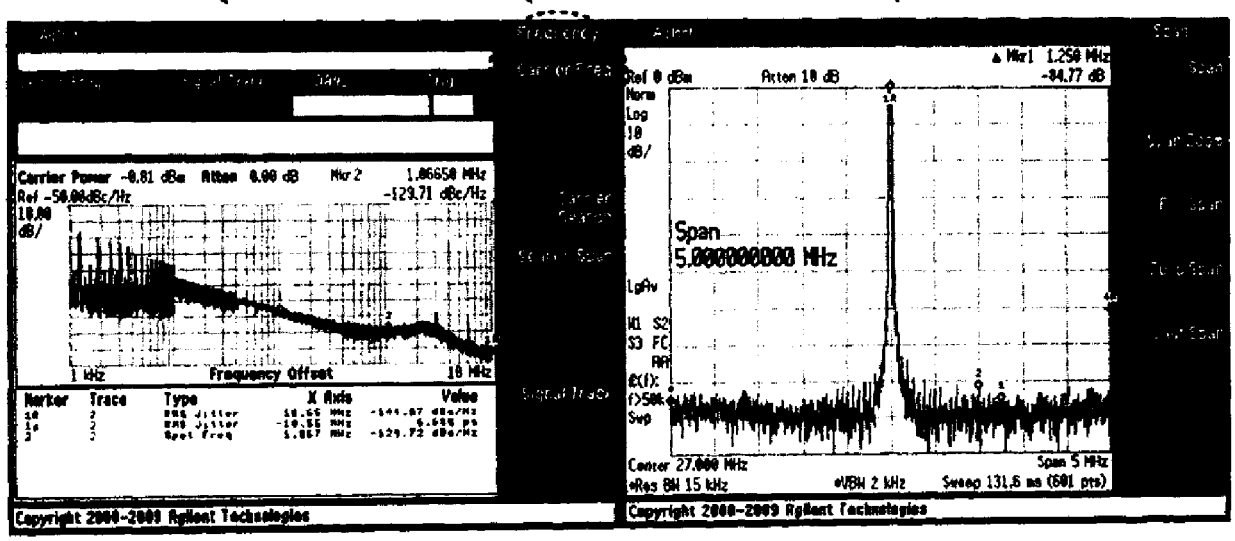
Figure 11:
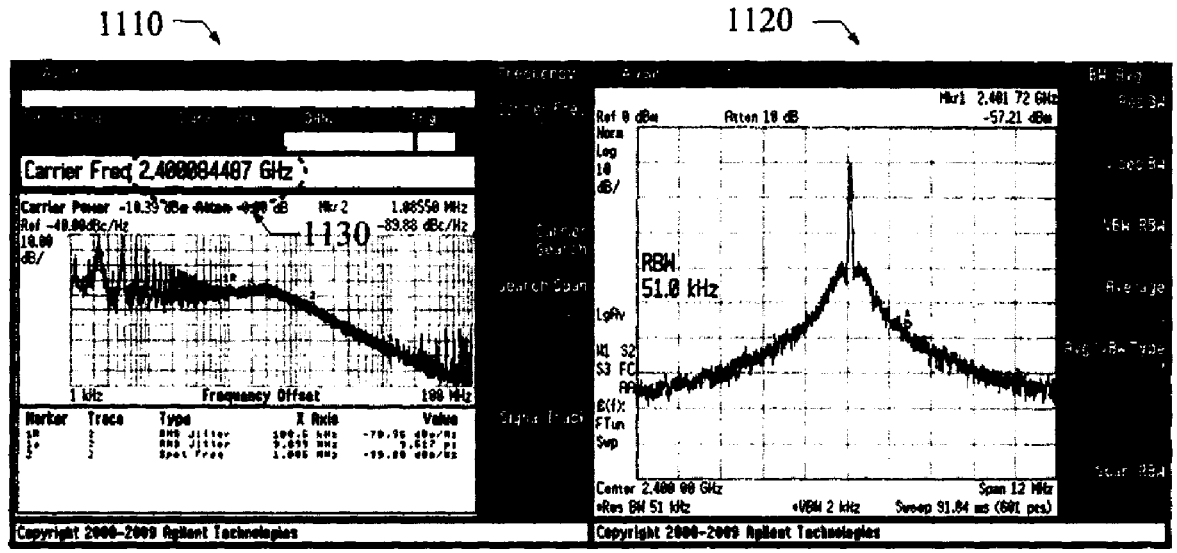
Figure 12:
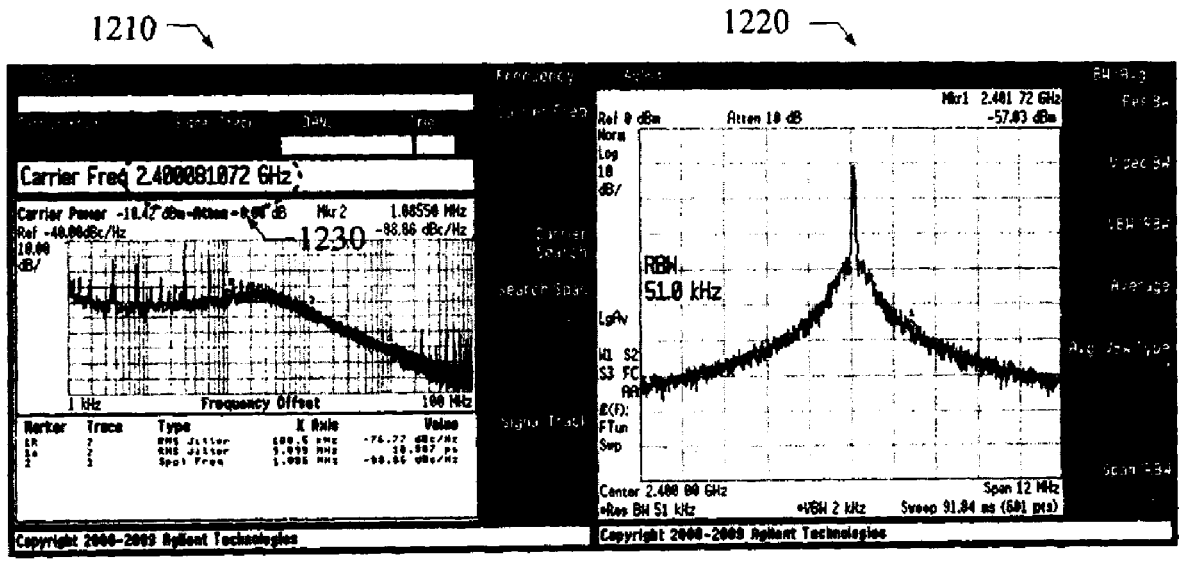
Figure 13:
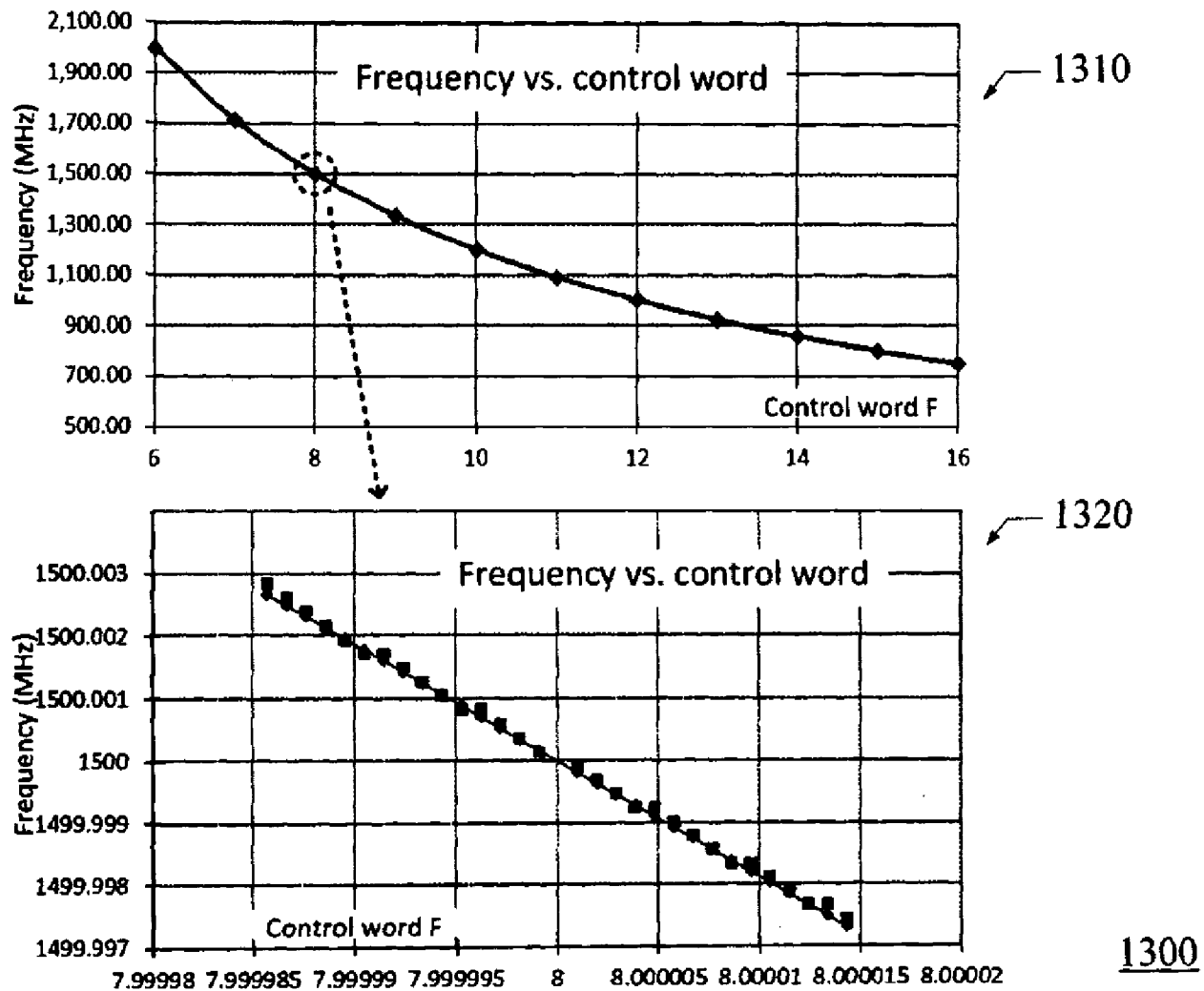
Figure 14:
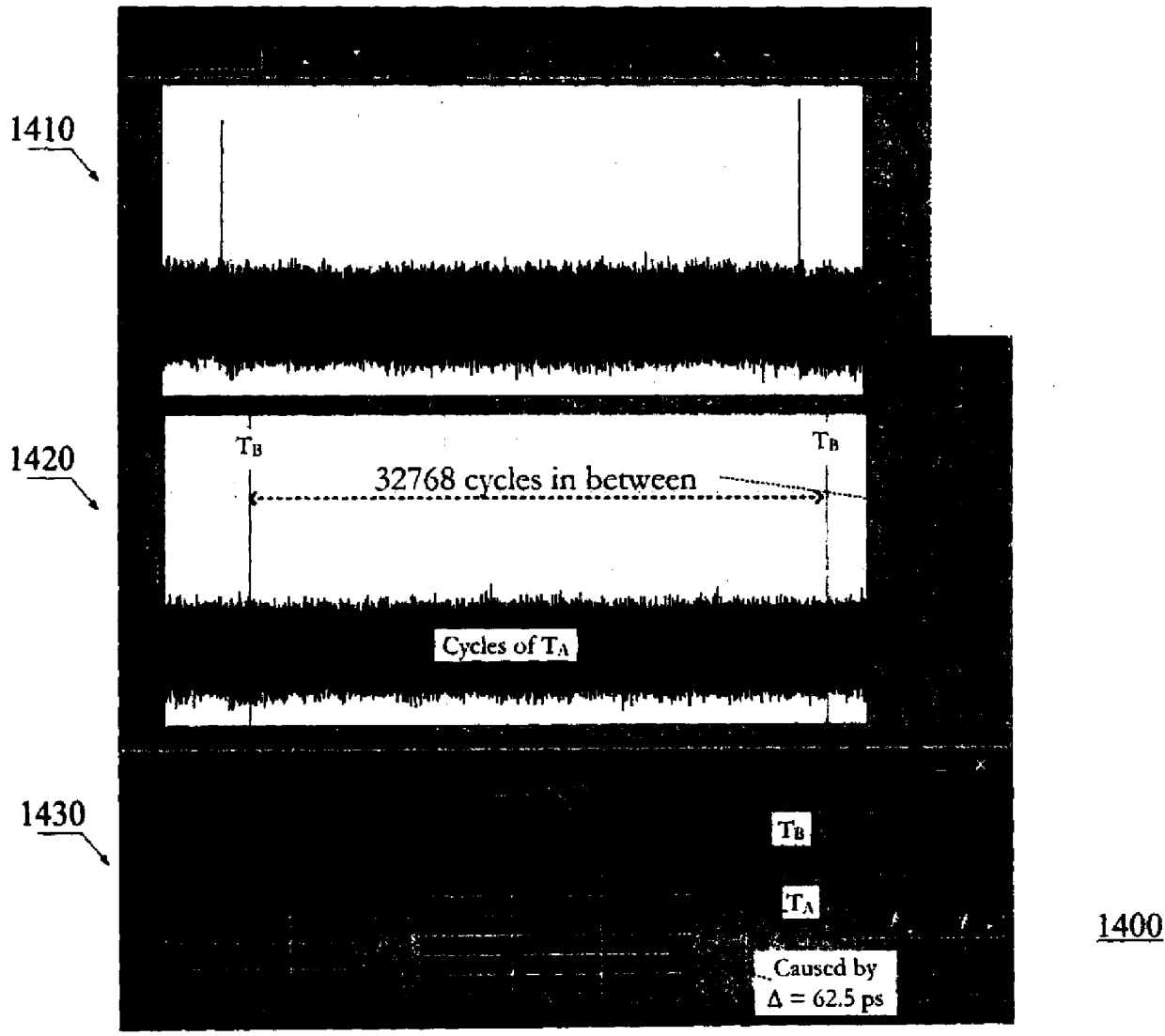
Figure 15:
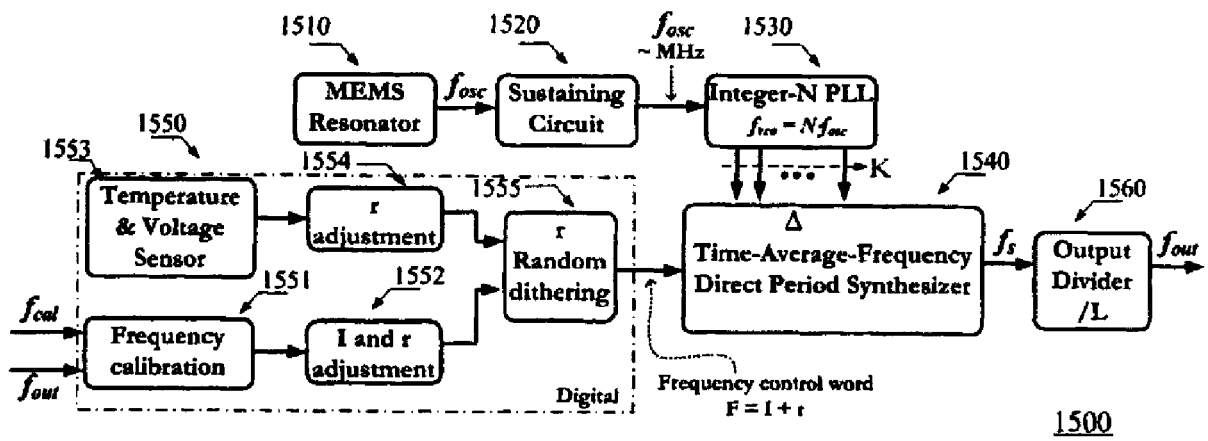
Figure 16:
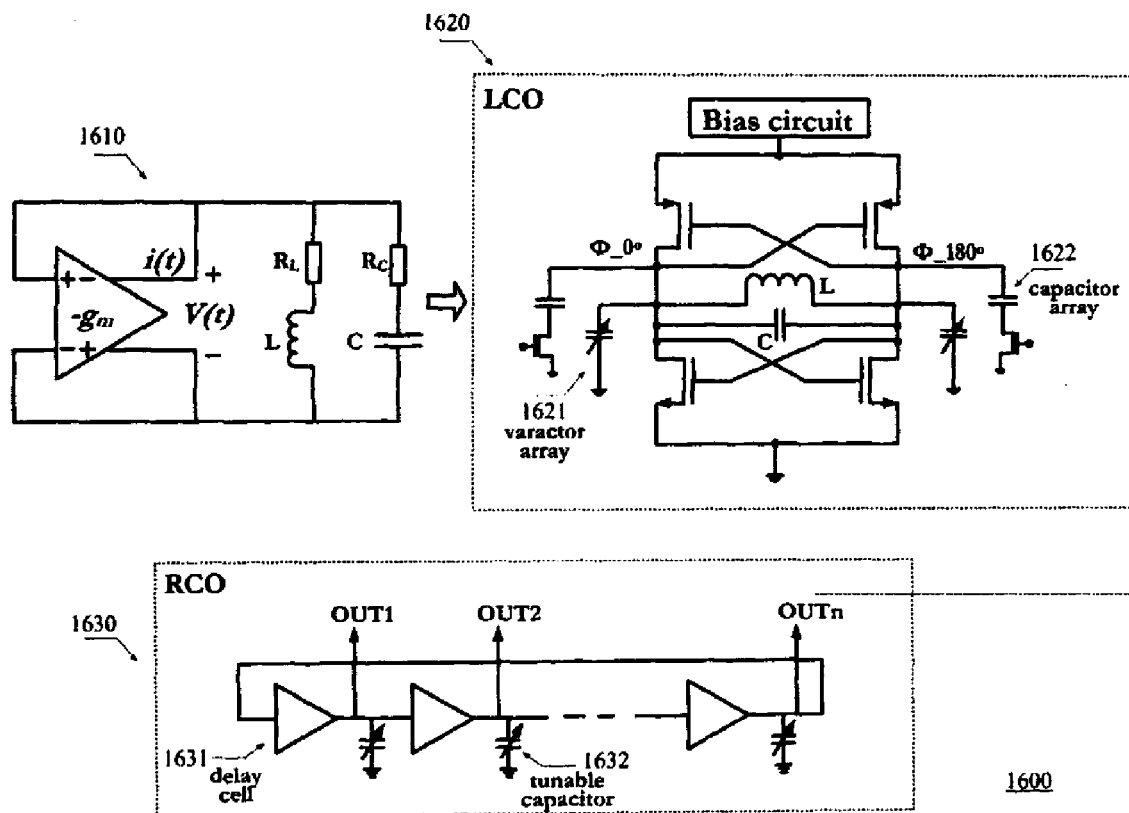
Figure 17:
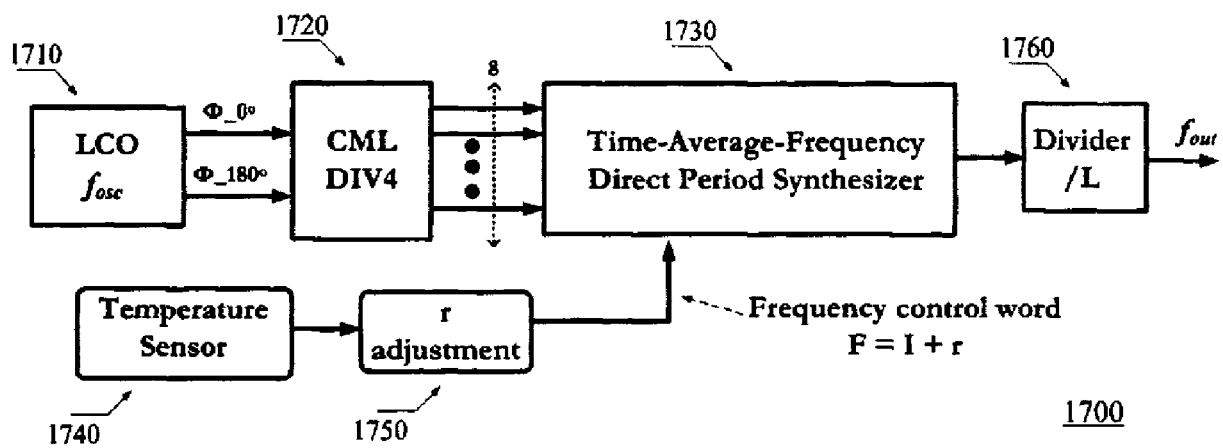
Figure 18:
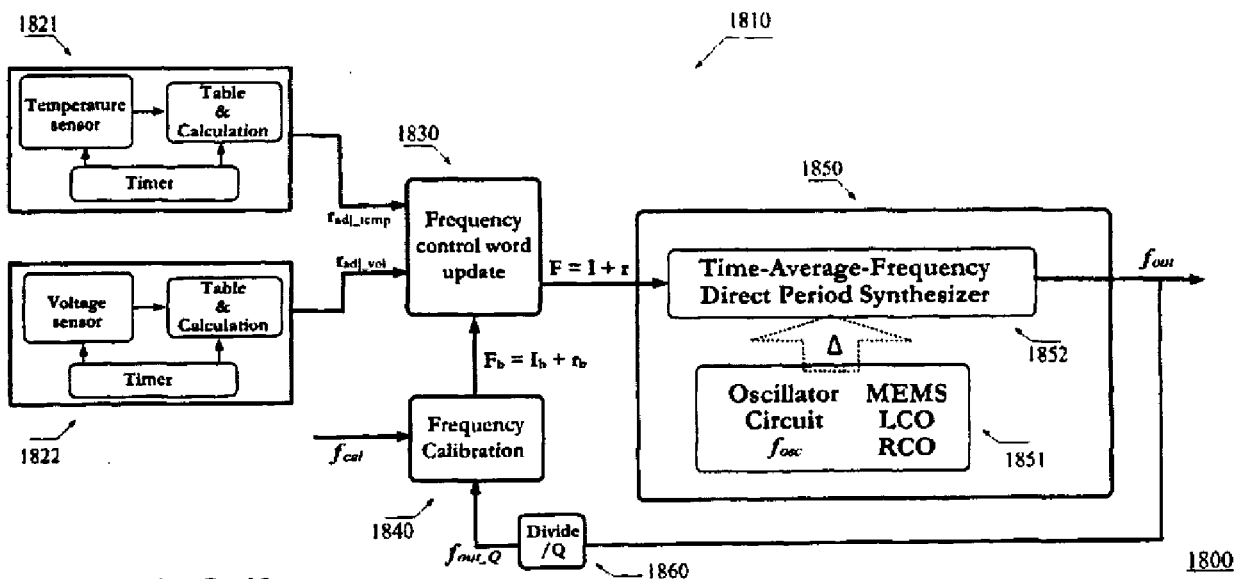
Figure 19:
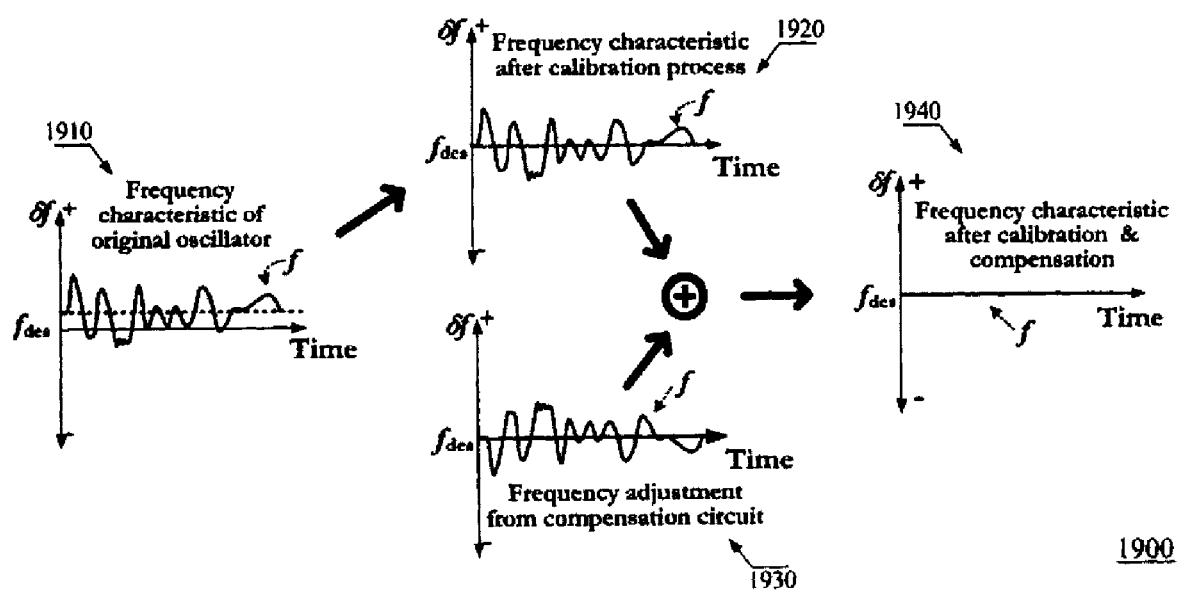
Figure 20:
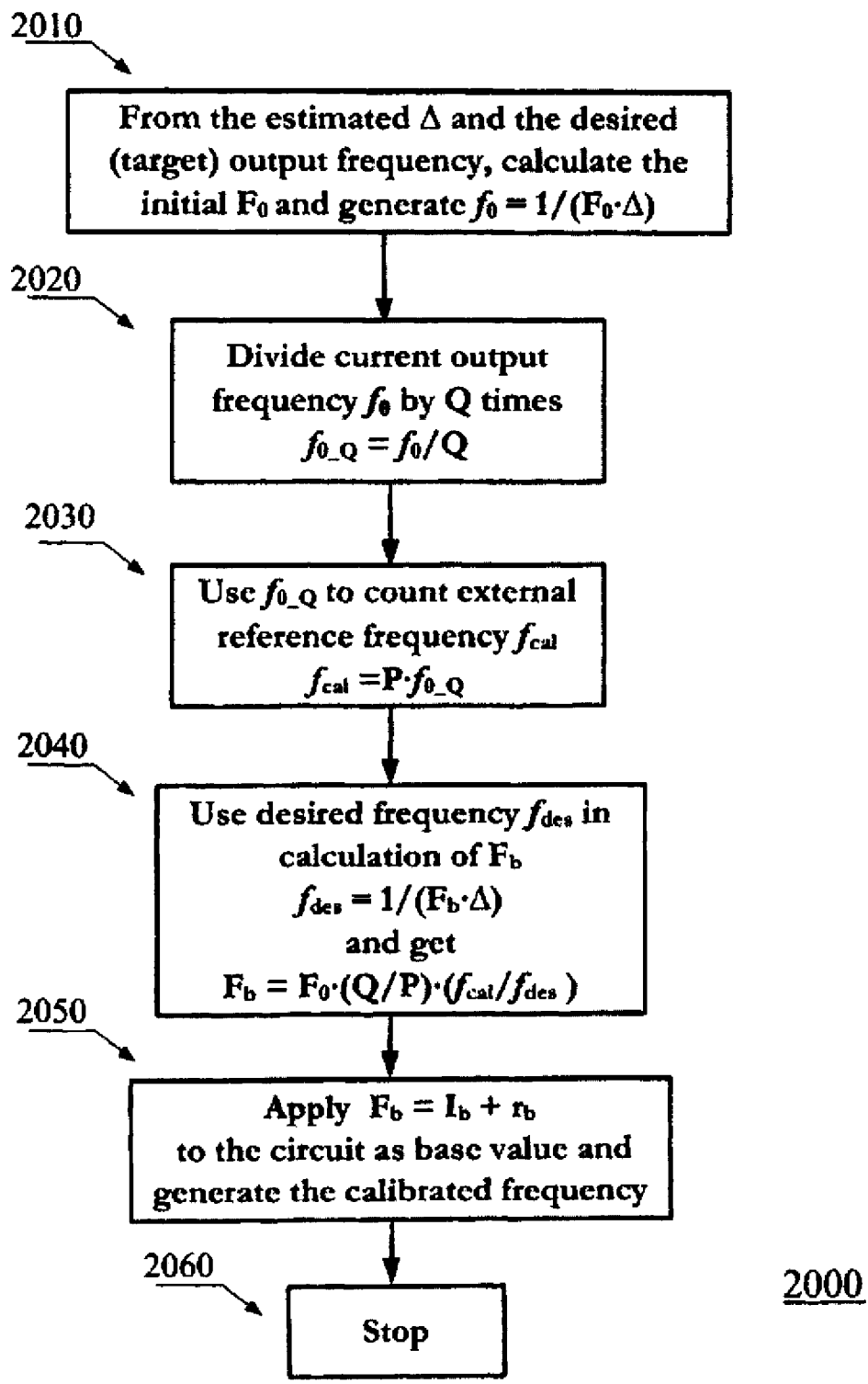
Figure 21:
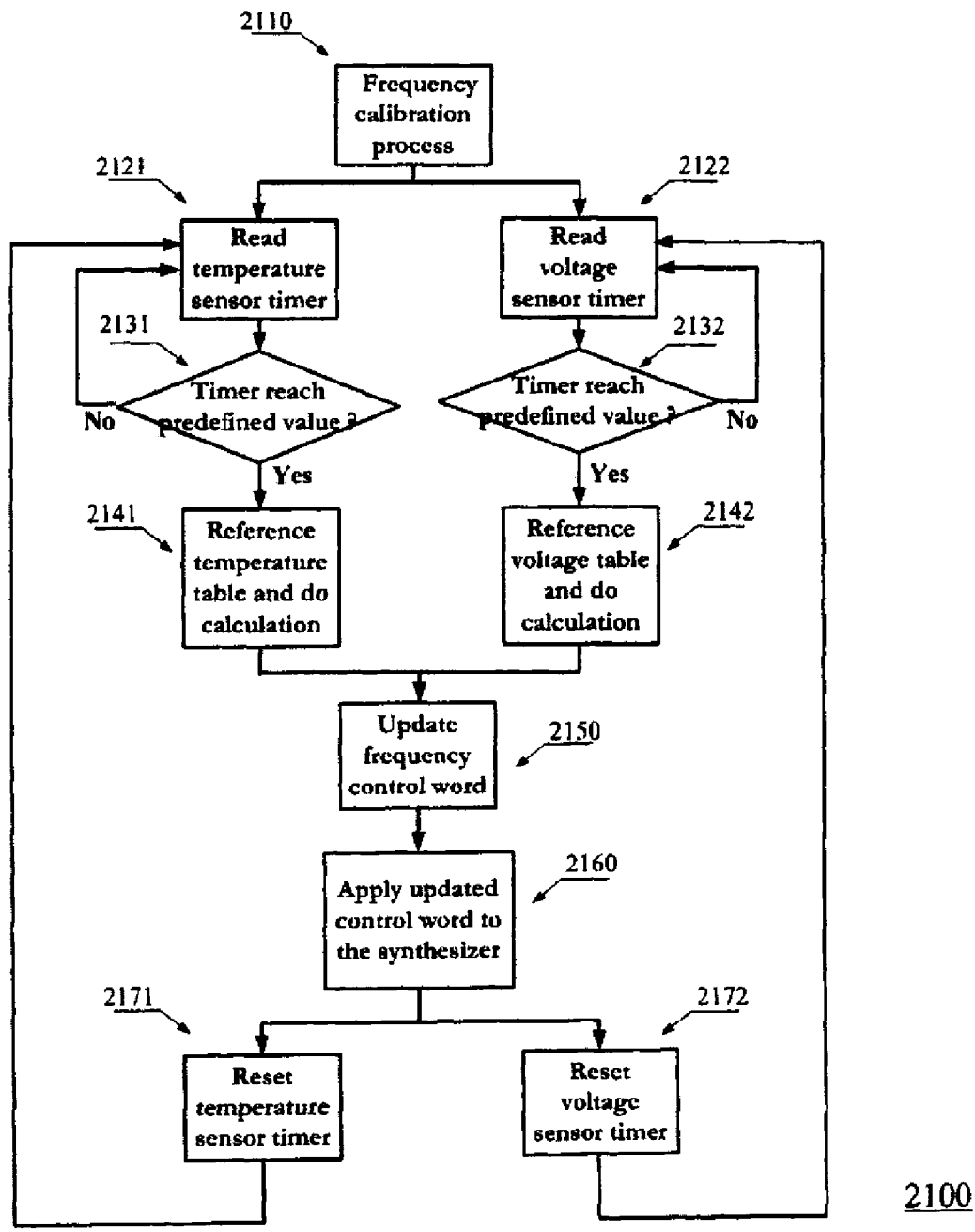

Referring to FIG. 21, the flow of using frequency calibration and frequency compensation to stabilize the crystal-less oscillator based clock generator's output frequency will now be described. Step 2110 is the process of frequency calibration which has been described in the context associated with FIG. 20. In step 2121, the timer inside temperature sensor subsystem is read. In step 2131, the timer's reading is checked against a predefined value. If timer's reading does not reach the value, return-to-step-2121 is performed. If the reading reaches the value, the flow proceeds to step 2141. In step 2141, the temperature sensor's output is checked against the frequency-vs.-temperature table and the corresponding frequency control word adjustment is calculated. The steps of 2122, 2132 and 2142 are the counterpart flow for voltage-related compensation. In step 2150, the frequency control word is updated by adding the adjustment from the temperature compensation circuit or the voltage compensation circuit. Step 2160 applies the new frequency control word to the synthesizer and tunes the output frequency to counteract the frequency variation. In next step 2171, or 2172, the corresponding timer is reset and return-to-step-2121 is performed.

The present invention further relates to a method of using Time-Average-Frequency direct period synthesizer to improve the frequency stability of crystal-less oscillator. The method includes the first step of calibrating the crystal-less frequency generator' output to a desired frequency by counting against an external reference signal of known frequency. The method then reads a temperature and/or voltage sensor output according to a predetermined schedule. The sensor output is used to calculate the corresponding adjustment in frequency control word. The method further applies the resulting frequency control word to the synthesizer to counteract the frequency variation caused by temperature and/or power supply voltage changes.

CONCLUSION/SUMMARY

Thus, the present invention provides circuit and method for improving the frequency stability of crystal-less frequency generator. The goal is to make an inaccurate and unstable frequency source become an accurate and stable one. It is achieved both by frequency calibration and frequency compensation through the use of Time-Average-Frequency concept and circuit. The present invention advantageously provides a significant decrease in cost and power usage since sophisticated calibration and compensation circuits used in conventional approach are avoided.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

[1] C. T.-C. Nguyen and R. T. Howe, "An integrated CMOS micromechanical resonator high-Q oscillator," *IEEE J. Solid-State Circuits*, vol. 34, no. 4, pp. 440-455, April 1999.

[2] D. Kenny and R. Henry, "Comparative Analysis of MEMS, Programmable and Synthesized Frequency Control Devices versus Traditional Quartz Based Devices," in *Proc. of IEEE Int. Freq. Control Symp.*, May 2008, pp. 396-401.

[3] K. Sundaresan, P. E. Allen and F. Ayazi, "Process and Temperature Compensation in a 7-MHz CMOS Clock Oscillator," *IEEE J. Solid-State Circuits*, pp. 433-442, February 2006.

[4] M. S. McCorquodale, G. A. Carichner, J. D. O'Day, S. M. Pernia et al., "A 25-MHz Self-Referenced Solid-State Frequency Source Suitable for XO-Replacement," *IEEE J. Solid-State Circuits*, pp. 943-956, May 2009.

[5] N. Sinoussi et al., "A Single LC Tank Self-Compensated CMOS Oscillator with Frequency Stability of +/−100 ppm from −40° C. to 85° C.", in *Proceeding of 2012 IEEE International Frequency Control Symposium*, pp. 1-5, 2012.

[6] L. Xiu, "The Concept of Time-Average-Frequency and Mathematical Analysis of Flying-Adder Frequency Synthesis Architecture," *IEEE Circuit And System Magazine*, $3^{rd}$ quarter, pp. 27-51, September 2008.

[7] L. Xiu, "*Nanometer Frequency Synthesis beyond Phase Locked Loop*," August 2012, John Wiley IEEE press.

[8] L. Xiu and Z. You, "High Speed Precision Frequency and Phase Synthesis," U.S. Pat. No. 6,940,937, December 2005.

What is claimed is:

1. A circuit for improving crystal-less frequency generator's frequency stability, comprising:
a temperature sensing circuit, for generating a temperature-related control signal, having an output for delivering said temperature-related control signal;
a voltage sensing circuit, for generating a voltage-related control signal, having an output for delivering said voltage-related control signal;
a frequency calibration circuit, having a first input for receiving a reference signal with a fixed and known frequency, having a second input for receiving a feedback signal, for generating a base frequency control word, having an output for delivering said base frequency control word;
a frequency control word update circuit, having a first input for receiving said temperature-related control signal, having a second input for receiving said voltage-related control signal, having a third input for receiving said base frequency control word, for generating a frequency control word to compensate temperature- and voltage-related frequency variation and to correct frequency error introduced in the manufacture process, having an output for delivering said frequency control word;
a crystal-less oscillator circuit, for generating an electrical voltage switching pattern having an oscillation frequency, for generating a base time unit from said switching pattern, having an output for delivering said base time unit;
a Time-Average-Frequency direct period synthesizer, having a first input for receiving said frequency control word from said frequency control word update circuit, having a second input for receiving said base time unit from said crystal-less oscillator circuit, for generating a signal with a desired frequency that is accurate and stable, having an output for delivering said signal;
a divider circuit, having an input for receiving said signal from said direct period synthesizer, for dividing received signal by a certain dividing ratio, having an output for delivering the divided signal as feedback signal;

the output of said divider circuit is connected to the second input of frequency calibration circuit.

2. The circuit of claim 1, wherein the voltage sensing circuit comprises:
   a timer circuit, for generating an output signal that becomes active once for every specified time frame;
   a voltage sensor, having an input for receiving said output signal from the timer circuit, for generating an output signal whose value is uniquely determined by current power supply voltage level;
   a calculation circuit, having a first input for receiving said output signal from the timer circuit, having a second input for receiving the output from said voltage sensor, for generating a voltage-related frequency control word adjustment signal, having an output for delivering said voltage-related frequency control word adjustment signal.

3. The circuit of claim 1, wherein the temperature sensing circuit comprises:
   a timer circuit, for generating an output signal that becomes active once for every specified time frame;
   a temperature sensor, having an input for receiving said output signal from the timer circuit, for generating an output signal whose value is uniquely determined by current temperature;
   a calculation circuit, having a first input for receiving said output signal from the timer circuit, having a second input for receiving the output from said temperature sensor, for generating a temperature-related frequency control word adjustment signal, having an output for delivering said temperature-related frequency control word adjustment signal.

4. The circuit of claim 1, wherein the crystal-less oscillator circuit comprises:
   a MEMS resonator, for generating a vibration, having an output for delivering the vibration;
   a sustaining circuit, having an input for receiving said vibration from the MEMS resonator, for converting the vibration into electrical pulses having a frequency, having an output for delivering the electrical pulses;
   an integer-N PLL, for generating a base time unit, comprising:
     a phase detector having a first input receiving a reference signal and a second input receiving a feedback signal, for producing an error signal at an output corresponding to a phase and frequency difference between the reference and feedback signal;
     a filter for low-pass filtering the error signal;
     a frequency divider of certain dividing ratio having an input receiving a clock signal, and an output coupled to the phase detector as the feedback signal;
     a voltage-controlled oscillator for generating a plurality of outputs at a frequency selected by the filtered error signal, wherein one of the plurality of the outputs is coupled to the frequency divider as the input signal, the base time unit is the time span between any two adjacent said outputs.

5. The circuit of claim 1, wherein the crystal-less oscillator circuit comprises:
   a LCO oscillator circuit, for generating an electrical oscillation of a frequency, having a first output for delivering a first electrical pulse train, having a second output for delivering a second electrical pulse train whose phase is 180° apart from said first pulse train;
   a divider circuit whose dividing ratio is a number of power of two, having a first input for receiving said first pulse train from the LCO oscillator, having a second input for receiving said second pulse train from the LCO oscillator, for generating a plurality of evenly-spaced-in-phase outputs at a frequency of LCO oscillation frequency divided by said dividing ratio, the base time unit is the time span between any two adjacent said outputs.

6. The circuit of claim 1, wherein the crystal-less oscillator circuit comprises:
   a RCO oscillator circuit, for generating an electrical oscillation of a frequency, for generating a plurality of evenly-spaced-in-phase outputs at said frequency, the base time unit is the time span between any two adjacent said outputs.

7. A method of improving crystal-less frequency generator's frequency stability, comprising the steps of:
   creating a base frequency control word by counting the number of pulses within one cycle of a divided down signal using a reference signal of known frequency as the counting clock;
   creating a temperature-related frequency adjustment signal;
   creating a voltage-related frequency adjustment signal;
   creating a frequency control word using the base frequency control word and the temperature-related frequency adjustment signal and the voltage-related frequency adjustment signal;
   generating a base time unit from a crystal-less oscillator having a plurality of equally-spaced-in-phase outputs, by using the time span between the rising or falling edges of any two adjacent outputs as the base time unit;
   generating an output signal from said base time unit by using a Time-Average-Frequency direct period synthesizer, said output signal having a frequency according to said frequency control word;
   generating said divided down signal by dividing said output signal from the Time-Average-Frequency direct period synthesizer by a selected ratio.

8. The method of claim 7, wherein the creating of temperature-related frequency adjustment signal comprising the steps of:
   generating a temperature signal from a temperature sensor in a predefined schedule;
   generating the temperature-related frequency adjustment signal by referencing said temperature signal in a frequency-vs.-temperature table.

9. The method of claim 7, wherein the creating of voltage-related frequency adjustment signal comprising the steps of:
   generating a voltage signal from a voltage sensor in a predefined schedule;
   generating the voltage-related frequency adjustment signal by referencing said voltage signal in a frequency-vs.-voltage table.

10. The method of claim 7, wherein the generating the base time unit from a crystal-less oscillator comprising the steps of:
    converting a MEMS resonator' vibration into an electrical pulse train by using a sustaining circuit;
    generating the plurality of equally-spaced-in-phase outputs from an integer-N PLL by using said electrical pulse train as the PLL's input reference.

11. The method of claim 7, wherein the generating the base time unit from a crystal-less oscillator comprising the steps of:
    generating two output signals from a LCO oscillator, the two output signals are 180° apart in their phases;
    generating the plurality of equally-spaced-in-phase outputs by dividing said two output signals using a selected dividing ratio of power of two.

12. The method of claim 7, wherein the generating the base time unit from a crystal-less oscillator comprising the steps of:

generating the plurality of equally-spaced-in-phase outputs from a multi-delay-stages RCO ring oscillator, all delay stages are identical in circuit structure, said plurality of outputs is made of the outputs from the stages.

13. A sequence of steps for improving crystal-less frequency generator's frequency stability, comprising the steps of:

creating a base frequency control word by a calibration process in first step;
checking the output of a temperature and/or a voltage timer in second step, go to the third step if the timer's output reaches a predefined value, otherwise repeat second step;
calculating the needed frequency control word adjustment based on the output of the temperature sensor and/or the voltage sensor in third step;
creating a frequency control word by using said base frequency control word generated in first step and said frequency control word adjustment generated in third step in fourth step;
applying said frequency control word to a Time-Average-Frequency direct period synthesizer and generating the corresponding frequency in its output signal in fifth step;
resetting the temperature and/or the voltage timer and go to the second step.

14. The sequence of steps of claim 13, wherein the calibration process comprising the steps of:

generating an initial frequency control word by using an estimated base time unit and the desired output frequency, applying said initial frequency control word to a Time-Average-Frequency direct period synthesizer and generating an output signal with corresponding frequency in step one;
dividing the output signal from said Time-Average-Frequency direct period synthesizer by a selected ratio and generating a divided signal in step two;
counting the number of pulses of a reference signal having a known frequency within one cycle of said divided signal in step three;
calculating the base frequency control word by using the desired frequency and said number of pulses generated in step three in step four.

* * * * *

UNITED STATES PATENT AND TRADEMARK OFFICE
CERTIFICATE OF CORRECTION

PATENT NO.         : 8,890,591 B1
APPLICATION NO.    : 14/140016
DATED              : November 18, 2014
INVENTOR(S)        : Liming Xiu It is certified that error appears in the above-identified patent and that said Letters Patent is hereby corrected as shown below:

Delete the title page and substitute therefore with the attached title page consisting of the corrected illustrative figure.

In the Drawings

Delete Drawing Sheets 1-14 and substitute therefore with the attached Drawing Sheets 1-14 consisting of high resolution FIGS. 1-21.

Signed and Sealed this
Thirty-first Day of March, 2015

Michelle K. Lee
*Director of the United States Patent and Trademark Office*

(12) United States Patent
Xiu

(10) Patent No.: US 8,890,591 B1
(45) Date of Patent: Nov. 18, 2014

(54) CIRCUIT AND METHOD OF USING TIME-AVERAGE-FREQUENCY DIRECT PERIOD SYNTHESZIER FOR IMPROVING CRYSTAL-LESS FREQUENCY GENERATOR FREQUENCY STABILITY

(71) Applicant: Liming Xiu, Plano, TX (US)

(72) Inventor: Liming Xiu, Plano, TX (US)

(73) Assignee: Liming Xiu, Plano, TX (US)

( * ) Notice: Subject to any disclaimer, the term of this patent is extended or adjusted under 35 U.S.C. 154(b) by 0 days.

(21) Appl. No.: 14/140,016

(22) Filed: Dec. 24, 2013

(51) Int. Cl.
H03L 7/06 (2006.01)

(52) U.S. Cl.
CPC .................................. H03L 7/06 (2013.01)
USPC ....... 327/156; 327/147; 375/240.01; 375/340

(58) Field of Classification Search
USPC .................. 327/147, 156; 375/240.01, 340
See application file for complete search history.

(56) References Cited

U.S. PATENT DOCUMENTS

| | | | | |
|---|---|---|---|---|
| 7,830,216 B1* | 11/2010 | Seth et al. | | 331/177 R |
| 8,120,389 B2* | 2/2012 | Xiu | | 327/105 |
| 8,165,199 B2* | 4/2012 | Xiu et al. | | 375/240.01 |
| 8,195,972 B2* | 6/2012 | Renner et al. | | 713/401 |
| 2009/0103604 A1* | 4/2009 | Xiu et al. | | 375/240.01 |
| 2011/0131439 A1* | 6/2011 | Renner et al. | | 713/401 |
| 2011/0285439 A1* | 11/2011 | Xiu | | 327/159 |
| 2012/0229171 A1* | 9/2012 | Xiu et al. | | 327/107 |
| 2014/0093015 A1* | 4/2014 | Xiu | | 375/340 |

* cited by examiner

*Primary Examiner* — Adam Houston

(57) ABSTRACT

A Time-Average-Frequency direct period synthesizer is used to improve crystal-less frequency generator's frequency stability. It includes (a) a temperature sensor circuit to compensate temperature-induced frequency instability; (b) a voltage sensor circuit to compensate voltage-induced frequency instability; (c) a calibration circuit to correct manufacture-related frequency error; (d) a frequency control word update circuit to receive the temperature- and voltage-related frequency adjustments, and the calibration-related adjustment, to generate the corresponding frequency control word in a predetermined schedule; (f) a Time-Average-Frequency direct period synthesizer to receive said frequency control word in the predetermined schedule and produce a clock signal with a frequency that is stable and accurate by counteracting the frequency variation caused by crystal-less oscillators' temperature and voltage dependence and correcting the frequency error introduced in manufacture process. Methods of correcting crystal-less oscillators' frequency error and compensating its frequency variation are also disclosed.

14 Claims, 14 Drawing Sheets

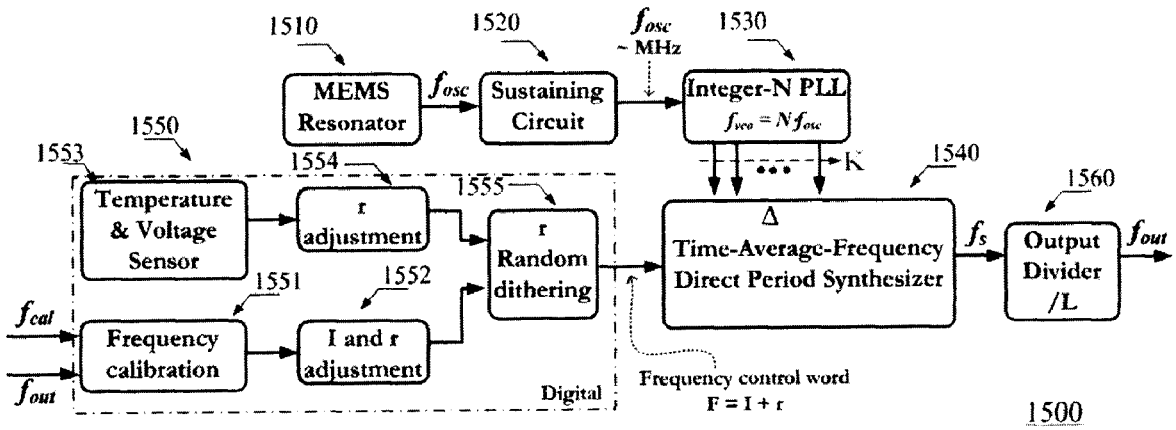

FIG. 15

UNITED STATES PATENT AND TRADEMARK OFFICE
CERTIFICATE OF CORRECTION

PATENT NO. : 8,890,591 B1
APPLICATION NO. : 14/140016
DATED : November 18, 2014
INVENTOR(S) : Liming Xiu It is certified that error appears in the above-identified patent and that said Letters Patent is hereby corrected as shown below:

Delete the title page and substitute therefore with the attached title page consisting of the corrected illustrative figure.

In the Drawings

Delete Drawing Sheets 1-14 and substitute therefore with the attached Drawing Sheets 1-14 consisting of high resolution FIGS. 1-21.

In the Specification

In column 3, line 39, equation (1), "$f_{TAF} = /T_{TAF}$" needs to be replaced with "$f_{TAF} = 1/T_{TAF}$".

In column 3, line 40, equation (2), "$\tau = a_i = 1$ for $i = 1$ to n;" needs to be replaced with "$\Sigma a_i = 1$ for $i = 1$ to n;".

In column 3, line 43, equation (2), "$f_{TAF} = /1T_{TAF}$" needs to be replaced with "$f_{TAF} = 1/T_{TAF}$".

In column 3, line 64, equation (3), the "$(l+r)$" needs to be replaced with "$(I+r)$".

In column 4, line 1, equation (4), the "$-\frac{dr}{l}$" needs to be replaced with "$-\frac{dr}{I}$".

In column 6, line 2 and 3, the "$F = 8 + 2^-{}_{15}$" needs to be replaced with "$F = 8 + 2^{-15}$".

In column 9, line 66, the "$f_{out}\alpha \cdot f_{cal}$" needs to be replaced with "$f_{out} = \alpha \cdot f_{cal}$".

This certificate supersedes the Certificate of Correction issued March 31, 2015.

Signed and Sealed this
Twelfth Day of May, 2015

Michelle K. Lee
*Director of the United States Patent and Trademark Office*

In column 11, line 34, the "dr = 1·(df/f)" needs to be replaced with "dr = I·(df/f)".

In column 12, line 52, the "From the estimated A" needs to be replaced with "From the estimated $\Delta$".

In column 12, line 67, the "$F_b = I_b + r_b = F_0 \cdot (Q/P) \cdot (f_{cal}/f_{des}$" needs to be replaced with "$F_b = I_b + r_b = F_0 \cdot (Q/P) \cdot (f_{cal}/f_{des})$".

(12) United States Patent
Xiu

(10) Patent No.: US 8,890,591 B1
(45) Date of Patent: Nov. 18, 2014

(54) CIRCUIT AND METHOD OF USING TIME-AVERAGE-FREQUENCY DIRECT PERIOD SYNTHESZIER FOR IMPROVING CRYSTAL-LESS FREQUENCY GENERATOR FREQUENCY STABILITY

(71) Applicant: Liming Xiu, Plano, TX (US)

(72) Inventor: Liming Xiu, Plano, TX (US)

(73) Assignee: Liming Xiu, Plano, TX (US)

( * ) Notice: Subject to any disclaimer, the term of this patent is extended or adjusted under 35 U.S.C. 154(b) by 0 days.

(21) Appl. No.: 14/140,016

(22) Filed: Dec. 24, 2013

(51) Int. Cl.
  *H03L 7/06* (2006.01)

(52) U.S. Cl.
  CPC .................. *H03L 7/06* (2013.01)
  USPC ....... 327/156; 327/147; 375/240.01; 375/340

(58) Field of Classification Search
  USPC .................. 327/147, 156; 375/240.01, 340
  See application file for complete search history.

(56) References Cited

U.S. PATENT DOCUMENTS

| | | | |
|---|---|---|---|
| 7,830,216 B1* | 11/2010 | Seth et al. | 331/177 R |
| 8,120,389 B2* | 2/2012 | Xiu | 327/105 |
| 8,165,199 B2* | 4/2012 | Xiu et al. | 375/240.01 |
| 8,195,972 B2* | 6/2012 | Renner et al. | 713/401 |
| 2009/0103604 A1* | 4/2009 | Xiu et al. | 375/240.01 |
| 2011/0131439 A1* | 6/2011 | Renner et al. | 713/401 |
| 2011/0285439 A1* | 11/2011 | Xiu | 327/159 |
| 2012/0229171 A1* | 9/2012 | Xiu et al. | 327/107 |
| 2014/0093015 A1* | 4/2014 | Xiu | 375/340 |

* cited by examiner

*Primary Examiner* — Adam Houston

(57) ABSTRACT

A Time-Average-Frequency direct period synthesizer is used to improve crystal-less frequency generator's frequency stability. It includes (a) a temperature sensor circuit to compensate temperature-induced frequency instability; (b) a voltage sensor circuit to compensate voltage-induced frequency instability; (c) a calibration circuit to correct manufacture-related frequency error; (d) a frequency control word update circuit to receive the temperature- and voltage-related frequency adjustments, and the calibration-related adjustment, to generate the corresponding frequency control word in a predetermined schedule; (f) a Time-Average-Frequency direct period synthesizer to receive said frequency control word in the predetermined schedule and produce a clock signal with a frequency that is stable and accurate by counteracting the frequency variation caused by crystal-less oscillators' temperature and voltage dependence and correcting the frequency error introduced in manufacture process. Methods of correcting crystal-less oscillators' frequency error and compensating its frequency variation are also disclosed.

14 Claims, 14 Drawing Sheets

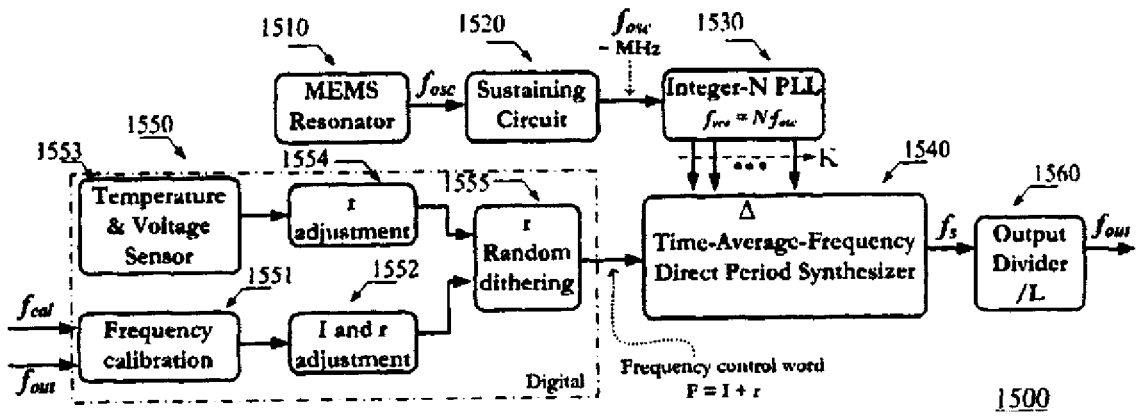

FIG. 15

Figure 9:
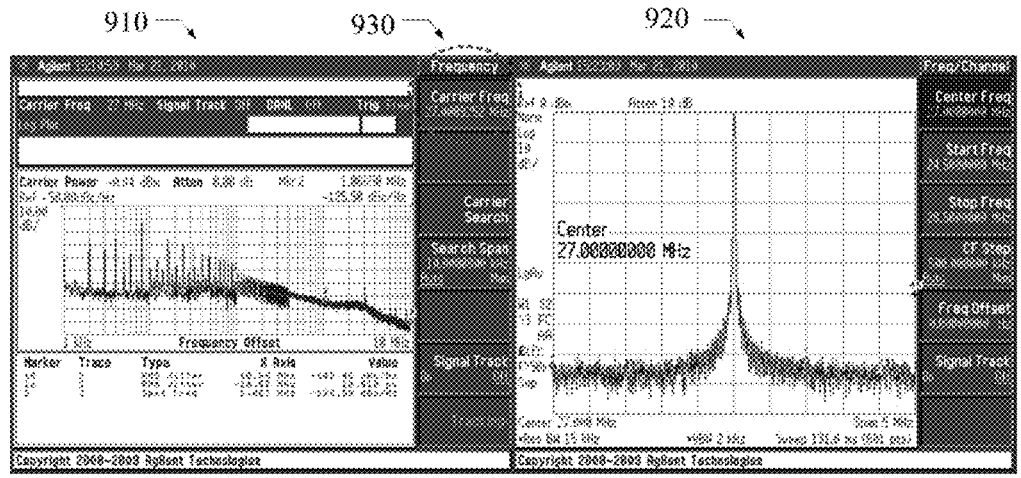
FIG. 9 is a diagram showing the spectrum and phase noise plots from a clock signal of 27.0009252 MHz generated from a Time-Average-Frequency direct period synthesizer.
Figure 10:
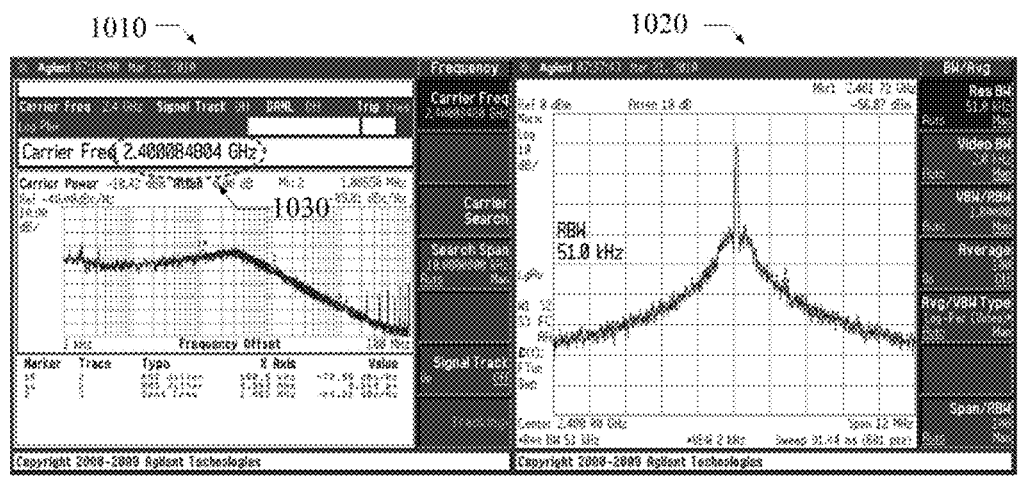
FIG. 10 is a diagram showing the spectrum and phase noise plots from a clock signal of 2.40008480 GHz generated from a Time-Average-Frequency direct period synthesizer.
Figure 11:
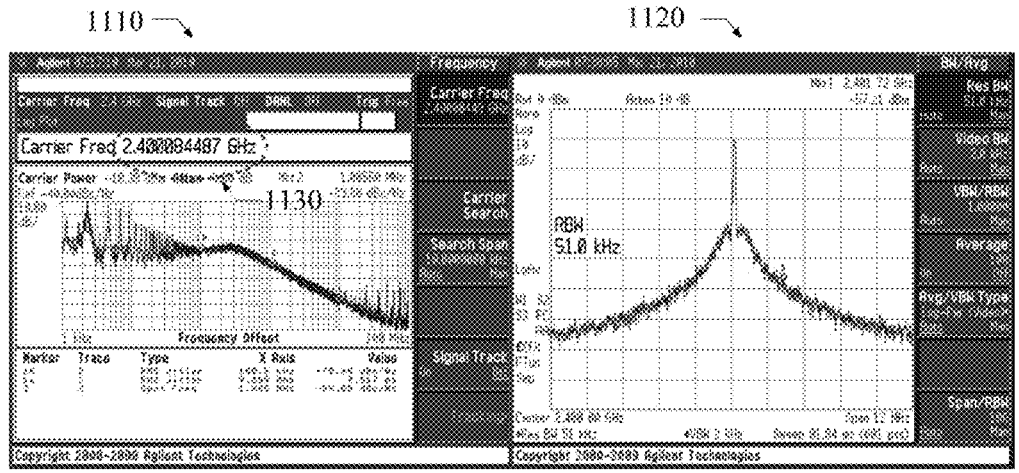
FIG. 11 is a diagram showing the spectrum and phase noise plots from a clock signal of 2.40008449 generated from a Time-Average-Frequency direct period synthesizer.
Figure 12:
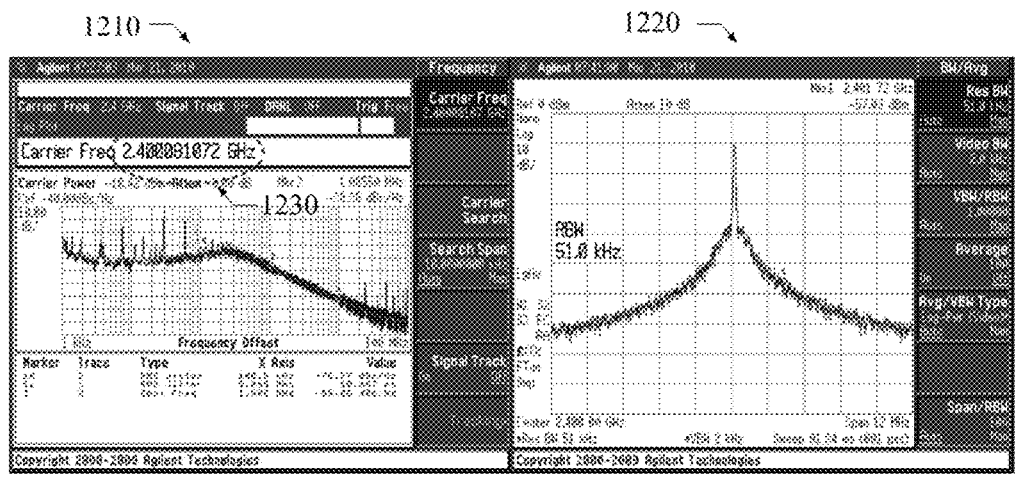
FIG. 12 is a diagram showing the spectrum and phase noise plots from a clock signal of 2.40008107 GHz generated from a Time-Average-Frequency direct period synthesizer.
Figure 13:
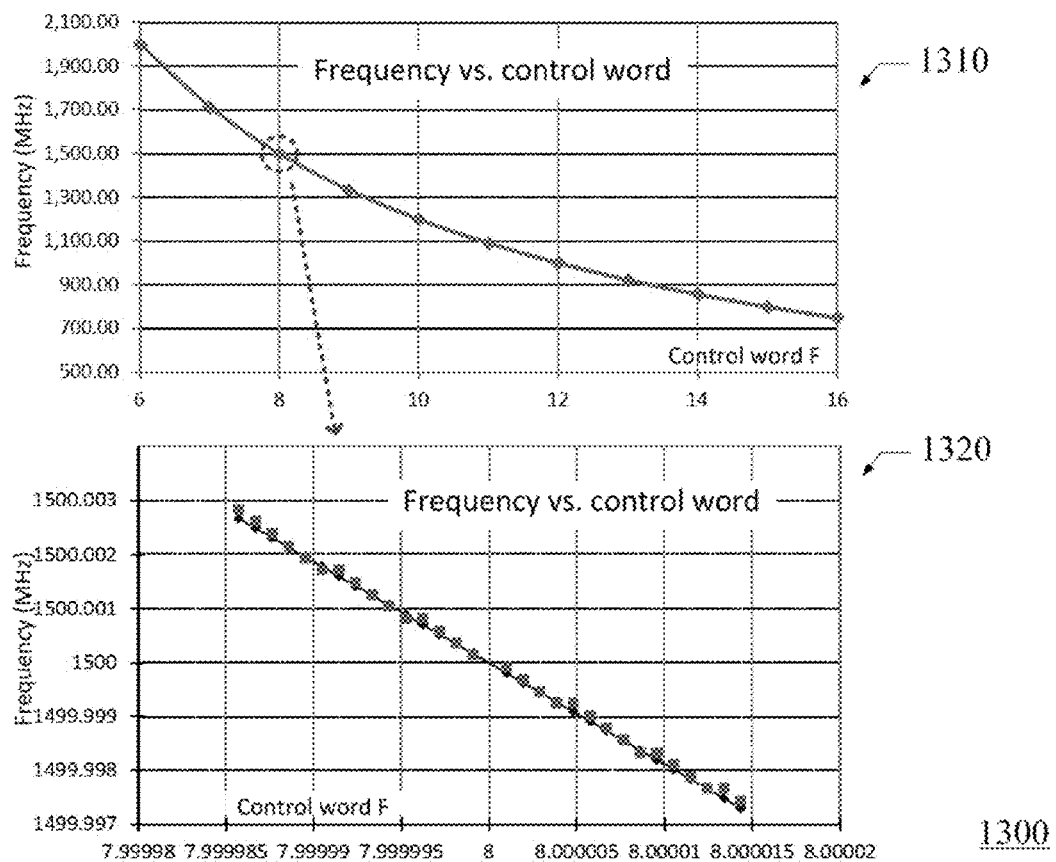
FIG. 13 is a diagram showing the measured frequency transfer function from a Time-Average-Frequency direct period synthesizer.
Figure 14:
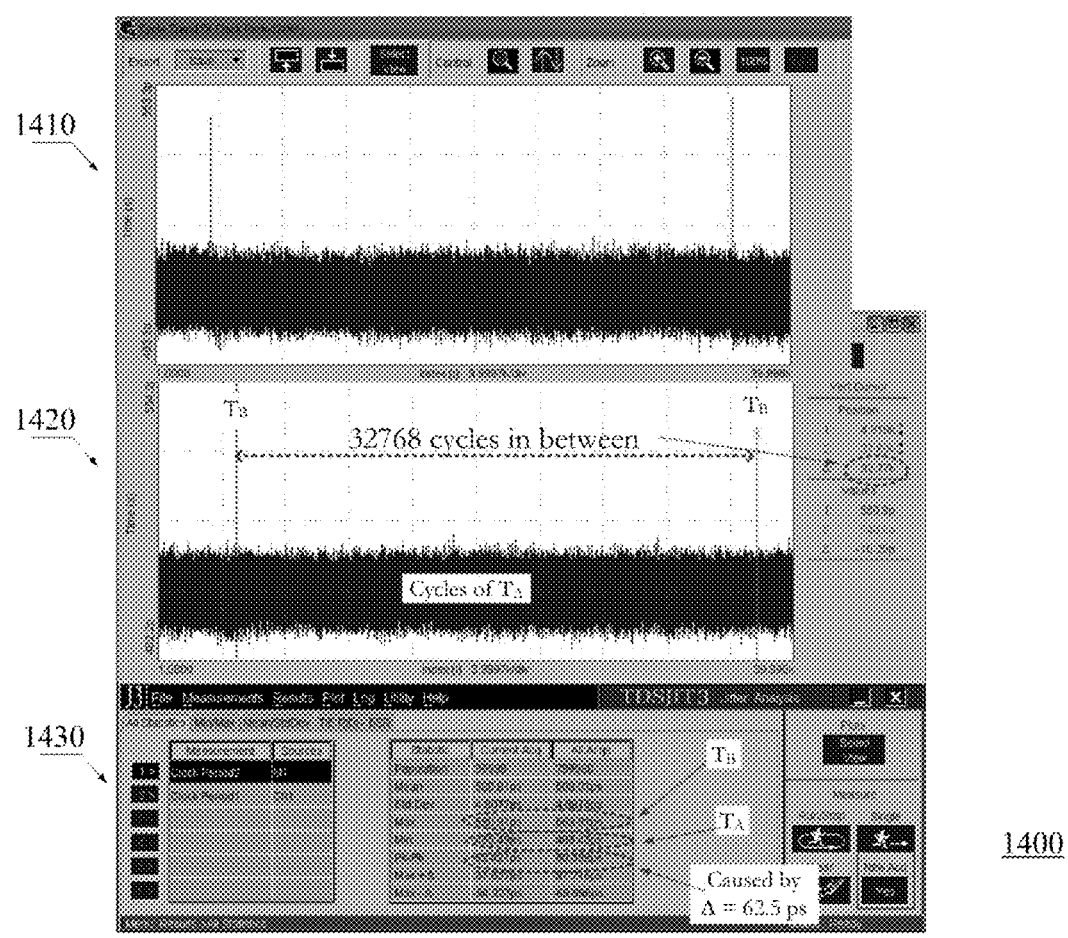
FIG. 14 is a diagram showing the cycle distribution of a clock signal generated from a Time-Average-Frequency direct period synthesizer.

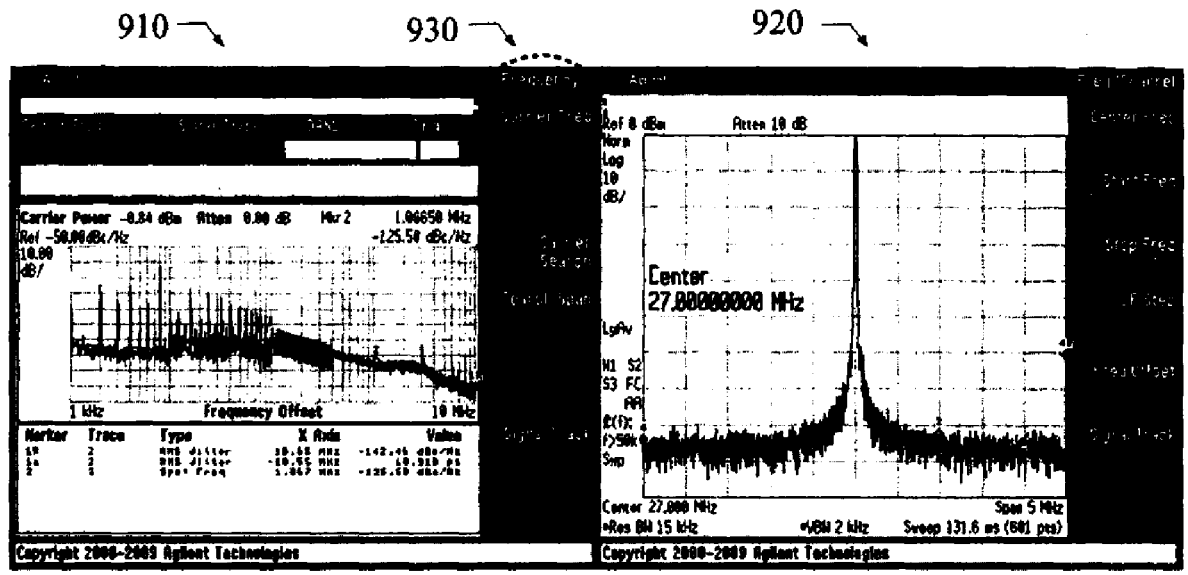
FIG. 9    900
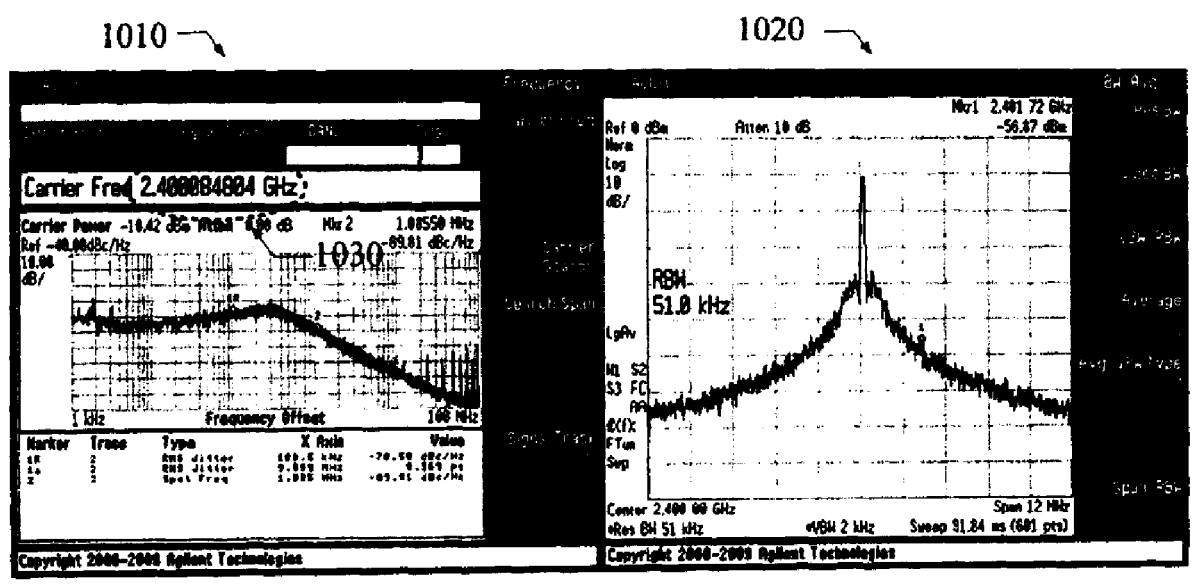
FIG. 10    1000